(12) United States Patent
Aoki

(10) Patent No.: US 7,190,113 B2
(45) Date of Patent: Mar. 13, 2007

(54) METHOD OF PRODUCING ELECTROLUMINESCENT ELEMENT

(75) Inventor: Daigo Aoki, Tokyo (JP)

(73) Assignee: Dai Nippon Printing Co., Ltd., Tokyo-to (JP)

(*) Notice: Subject to any disclaimer, the term of this patent is extended or adjusted under 35 U.S.C. 154(b) by 364 days.

(21) Appl. No.: 10/634,009

(22) Filed: Aug. 4, 2003

(65) Prior Publication Data

US 2004/0075384 A1    Apr. 22, 2004

(30) Foreign Application Priority Data

Aug. 5, 2002    (JP)    ............... 2002-227222

(51) Int. Cl.
H05B 33/00 (2006.01)
H05B 33/14 (2006.01)
H01L 51/50 (2006.01)

(52) U.S. Cl. ............... 313/506; 313/503; 313/504; 313/509

(58) Field of Classification Search ............... 313/504, 313/506, 509; 427/66; 430/319–321; 428/690
See application file for complete search history.

(56) References Cited

U.S. PATENT DOCUMENTS

| | | | |
|---|---|---|---|
| 5,739,545 A | 4/1998 | Guha | |
| 6,878,470 B2 * | 4/2005 | Kawamura et al. | 430/319 |
| 6,949,328 B2 * | 9/2005 | Ito et al. | 430/321 |
| 2003/0008224 A1 * | 1/2003 | Fujita et al. | 430/319 |
| 2003/0129321 A1 * | 7/2003 | Aoki | 427/66 |
| 2004/0155578 A1 * | 8/2004 | Ito et al. | 313/506 |
| 2005/0168140 A1 * | 8/2005 | Nakamura et al. | 313/506 |

FOREIGN PATENT DOCUMENTS

| | | |
|---|---|---|
| EP | 1128438 A | 8/2001 |
| JP | 7142173 A | 6/1995 |
| JP | 2001237069 A | 8/2001 |
| JP | 2002015867 A | 1/2002 |
| JP | 2002231446 | 8/2002 |

* cited by examiner

Primary Examiner—Mariceli Santiago
(74) Attorney, Agent, or Firm—Timothy J. Keefer; Seyfarth Shaw LLP

(57) ABSTRACT

A method of producing an electroluminescent element. Preparing an electrode layer, and forming, on the electrode layer or an electric charge injection transportation layer formed on the electrode layer, a decomposition removal layer. Placing a photocatalyst treatment layer and the decomposition removal layer at an interval of 200 μm or less and conducting pattern irradiation to form the decomposition removal layer into a pattern. Removing the photocatalyst treatment layer from the decomposition removal, and forming an organic electroluminescent layer on the electrode layer or the decomposition removal layer according to the pattern of the decomposition removal layer.

4 Claims, 6 Drawing Sheets

METHOD OF PRODUCING ELECTROLUMINESCENT ELEMENT

BACKGROUND OF THE INVENTION

1. Field of the Invention

The present invention relates to a method of producing an electroluminescent element in which patterning of an organic electroluminescent (hereinafter, electroluminescent is abbreviated as EL in some cases) layer is conducted by using a layer in which a property changes by the action of a photocatalyst in irradiation with energy, the method being not influenced by the photocatalyst.

2. Description of the Related Art

In EL elements, holes and electrons injected from facing electrodes bond in a light emitting layer, excites a fluorescent substance in the light emitting layer by the energy, and emit light in color corresponding to the fluorescent substance, therefore, EL elements are attract to attention as a sheet display element of self light emitting type. Among them, organic thin film EL displays using an organic substance as a light emitting material, have high light emitting efficiency such as realizing of emission of high brilliance even if applied voltage is slightly less than 10 V, and the like, are capable of emitting light with a simple element structure, and there are expectations of application thereof to advertisement displays on which a specific pattern is emitted and displayed and to other low cost simple displays.

In production of displays using such EL elements, patterning of an organic EL layer and the like is usually conducted. As the method of patterning such EL elements, there are suggested a method in which a light emitting material is vapor-deposited via a shadow mask, a method of divisional coating by ink jet, a method of breaking a specific light emitting dye by irradiation with ultraviolet ray, various patterning methods such as a screen printing method and the like, however, there is also suggested a method of using a photocatalyst which enables easy formation of elaborate patterning.

These methods of producing an EL element using a photocatalyst utilize a phenomenon in which when a layer containing a photocatalyst is irradiated with energy, the wettability of the layer containing a photocatalyst varies due to the action of the photocatalyst in irradiation. Namely, by utilizing a pattern of this wettability difference, an organic EL layer is formed into a pattern. The method of producing an EL element using a photocatalyst like that is a useful method in that works required for patterning of an organic EL layer can be significantly reduced since a pattern of a wettability difference can be formed only by irradiation with energy.

However, such methods of producing an EL element using a photocatalyst have a problem that there is supposed a possibility of an influence, from a photocatalyst, on an EL element due to the semi permanent action of a photocatalyst contained inside, since a layer containing a photocatalyst is contained in the constitution of an EL element.

SUMMARY OF THE INVENTION

The present invention has been accomplished in view of the above-mentioned problem and the main object thereof is to provide a method of producing an EL element wherein patterning of an organic EL layer is easy, and an influence by a photocatalyst is little.

In order to achieve the above object, in the present invention, there is provided a method of producing an EL element comprising: at least a decomposition removal layer forming process of preparing an electrode layer, and forming, on the electrode layer or an electric charge injection transportation layer formed on the electrode layer, a decomposition removal layer which is decomposed and removed by the action of a photocatalyst in irradiation with energy and having a different contact angle with liquid from that of the electrode layer or the electric charge injection transportation layer; a decomposition removal layer patterning process of using a photocatalyst treatment layer substrate having a photocatalyst treatment layer containing a photocatalyst formed on a substrate, and placing the photocatalyst treatment layer and the decomposition removal layer at an interval of 200 μm or less, then, conducting pattern irradiation with energy from predetermined direction so that a region to be decomposed and removed of the decomposition removal layer is irradiated with energy, to form the decomposition removal layer into a pattern; a removing process of removing the photocatalyst treatment layer from the decomposition removal layer; and an organic EL layer forming process of forming an organic EL layer on the electrode layer or electric charge injection transportation layer according to the pattern of the decomposition removal layer.

In the present invention, a decomposition removal layer which is decomposed and removed by the action of a photocatalyst in irradiation with energy is formed into a pattern by irradiation with energy via a photocatalyst treatment layer containing a photocatalyst, further, such a decomposition removal layer has different contact angle with liquid from that of an electrode layer when the decomposition removal layer is formed on the electrode layer, or from that of a electric charge injection transportation layer when the decomposition removal layer is formed on the electric charge injection transportation layer, therefore, complicated works and the like are not particularly required, and an organic EL layer in the form of pattern corresponding to the pattern of the decomposition removal layer can be formed by utilizing these wettability differences. Further, since the photocatalyst treatment layer is removed from the decomposition removal layer after patterning of the decomposition removal layer, the photocatalyst treatment layer is not contained in an EL element itself, therefore, there is a merit of no worry about an influence by the action of a photocatalyst in the photocatalyst treatment layer.

In the present invention, it is preferable that the above-mentioned decomposition removal layer is any of a self-assembled monolayer, Langmuir Blodgett film and layer-by-layer self-assembled film. The reason for this is that by forming a decomposition removal layer from such a material, a thin film having relatively high strength which can be decomposed by the action of a photocatalyst can be formed. Further reason for this is that by selecting the material of a thin film, an excellent difference in wettability can be formed from that of an electrode layer or electric charge injection transportation layer exposed in decomposing and removing the decomposition removal layer.

Further, in the present invention, there is provided a method of producing an EL element comprising: at least a decomposition removal layer forming process of preparing an electrode layer, and forming, on the electrode layer or an electric charge injection transportation layer formed on the electrode layer, a decomposition removal layer which is formed of a material having an electric charge shielding property and decomposed and removed by the action of a photocatalyst in irradiation with energy; a decomposition removal layer patterning process of using a photocatalyst treatment layer substrate having a photocatalyst treatment layer containing a photocatalyst formed on a substrate, and placing the photocatalyst treatment layer and the decomposition removal layer at an interval of 200 μm or less, then, conducting pattern irradiation with energy from predetermined direction so that a region to be decomposed and removed of the decomposition removal layer is irradiated with energy, to form the decomposition removal layer into a pattern; a removing process of removing the photocatalyst treatment layer from the decomposition removal layer; and an organic EL layer forming process of forming an organic EL layer so as to cover the surface of the decomposition removal layer and the electrode layer or the electric charge injection transportation layer exposed by decomposition and removal of this decomposition removal layer.

In the present invention, a decomposition removal layer which is decomposed and removed by the action of a photocatalyst in irradiation with energy is formed into a pattern by irradiation with energy via a photocatalyst treatment layer containing a photocatalyst, further, an organic EL layer is formed so as to cover an electrode layer and decomposition removal layer, for example, when the decomposition removal layer formed as described above is located on the electrode layer, or as to cover an electric charge injection transportation layer and decomposition removal layer when the decomposition removal layer is formed on the electric charge injection transportation layer, consequently, the decomposition removal layer has an electric charge shielding property, and electric charge are not injected into an organic EL layer located on the decomposition removal layer. Therefore, even if an organic EL layer is formed on the whole surface, the same effect can be obtained as in the case of formation of an organic EL layer into a pattern. Further, since the photocatalyst treatment layer is removed from the decomposition removal layer after patterning of the decomposition removal layer, the photocatalyst treatment layer is not contained in an EL element itself, therefore, there is a merit of no worry about an influence by the action of a photocatalyst in the photocatalyst treatment layer.

Further, in the present invention, there is provided a method of producing an electroluminescent element comprising: an electrode layer patterning process of using a photocatalyst treatment layer substrate having a photocatalyst treatment layer containing a photocatalyst formed on a substrate, and placing the photocatalyst treatment layer and the electrode layer at an interval of 200 μm or less, then, conducting pattern irradiation with energy from predetermined direction, to form a pattern of a wettability difference on the surface of the electrode layer; a removing process of removing the photocatalyst treatment layer from the electrode layer; and an organic electroluminescent layer forming process of forming an organic electroluminescent layer on a region of the electrode layer having improved wettability with liquid.

In the present invention, a pattern of a wettability difference is formed on the surface of an electrode layer by irradiation with energy via a photocatalyst treatment layer containing a photocatalyst, further, an organic EL layer is formed on the electrode layer by utilizing this pattern of a wettability difference, therefore, post treatments after irradiation with energy is not particularly required and an organic EL layer can be formed into a highly precise pattern. Further, since the photocatalyst treatment layer is removed from the electrode layer after a pattern of a wettability difference is formed on the surface of the electrode layer, the photocatalyst treatment layer is not contained in an EL element itself, therefore, there is a merit of no influence on an EL element by the action of a photocatalyst in the photocatalyst treatment layer.

Further, in the present invention, there is provided a method of producing an electroluminescent element comprising: at least an electric charge injection transportation layer forming process of forming an electric charge injection transportation layer which wettability changes so as to lower a contact angle with liquid by the action of a photocatalyst in irradiation with energy, on an electrode layer; an electric charge injection transportation layer patterning process of using a photocatalyst treatment layer substrate having a photocatalyst treatment layer containing a photocatalyst formed on a substrate, and placing the photocatalyst treatment layer and the electric charge injection transportation layer at an interval of 200 μm or less, then, conducting pattern irradiation with energy from predetermined direction, to form a pattern of a wettability difference in on the electric charge injection transportation layer; a removing process of removing the photocatalyst treatment layer from the electric charge injection transportation layer; and an organic electroluminescent layer forming process of forming an organic electroluminescent layer on a region of the electric charge injection transportation layer having improved wettability with liquid.

In the present invention, a pattern of a wettability difference is formed on an electric charge injection transportation layer by irradiation with energy via a photocatalyst treatment layer containing a photocatalyst, further, an organic EL layer is formed on the electric charge injection transportation layer by utilizing this pattern of a wettability difference, therefore, post treatments after irradiation with energy is not particularly required and an organic EL layer can be formed into a highly precise pattern. Further, since the photocatalyst treatment layer is removed from the electric charge injection transportation layer after a pattern of a wettability difference is formed on the electric charge injection transportation layer, the photocatalyst treatment layer is not contained in an EL element itself, therefore, there is a merit that an influence by the action of a photocatalyst in the photocatalyst treatment layer can be avoided.

In the present invention, it is preferable that the above-mentioned electric charge injection transportation layer comprises at least a photocatalyst and an organopolysiloxane which is a hydrolysis condensate or co-hydrolysis condensate of one kind or two or more kinds of silicon compounds represented by a formula $$Y_n SiX_{(4-n)}$$

(wherein, Y represents an alkyl group, fluoroalkyl group, vinyl group, amino group, phenyl group or epoxy group, and X represents an alkoxyl group or halogen, n represents an integer of 0 to 3.).

The reason for this is that, by the constitution of the electric charge injection transportation layer containing such an organopolysiloxane and photocatalyst, its sensitivity is improved in irradiation with energy via a photocatalyst treatment layer substrate to form a pattern of a wettability difference on the electric charge injection transportation layer, and a higher precise pattern can be formed on the electric charge injection transportation layer.

In the present invention, the photocatalyst contained in the above-mentioned electric charge injection transportation layer and photocatalyst treatment layer preferably includes one kind or two or more kinds of substances selected from titanium dioxide ($TiO_2$), zinc oxide (ZnO), stannic oxide ($SnO_2$), strontium titanate ($SrTiO_3$), tungsten oxide ($WO_3$), bismuth oxide ($Bi_2O_3$) and iron oxide ($Fe_2O_3$), and, among these substances, titanium dioxide ($TiO_2$) is particularly preferable. The reason for this is that titanium dioxide has high band gap energy and consequently is effective as a photocatalyst, and chemically stable and non-toxic, and easily available.

In the present invention, it is preferable that, in irradiation with energy in the above-mentioned decomposition removal layer patterning process, the above-mentioned electrode layer patterning process and the above-mentioned electric charge injection transportation layer patterning process, the interval between the above-mentioned photocatalyst treatment layer and the above-mentioned decomposition removal layer, the above-mentioned electrode layer or the above-mentioned electric charge injection transportation layer is in a range of 0.2 µm to 10 µm. The reason for this is that, by placing the photocatalyst treatment layer at an interval in the above-mentioned range in irradiation with energy, the decomposition removal layer can be decomposed and removed by irradiation with energy for a short period of time, further, an electrode layer or electric charge injection transportation layer whose wettability is changed can be obtained.

In the present invention, it is preferable that the above-mentioned electrode layer is formed on a base material. The reason for this is that, by forming an EL layer on a base material when the above-mentioned EL element does not have a self supporting property, and the like, strength can be improved.

Further, in the present invention, there is provided an EL element comprising: at least a first electrode layer; a decomposition removal layer which is in the form of pattern on the first electrode layer, or on an electric charge injection transportation layer formed on the first electrode layer, decomposed and removed by the action of a photocatalyst in irradiation with energy, and shows different contact angle with liquid from that of the first electrode layer or the electric charge injection transportation layer; an organic EL layer which is in the form of pattern on the electrode layer, or on electric charge injection transportation layer exposed by decomposition and removal of the decomposition removal layer and contains at least a light emitting layer; and a second electrode layer formed on the organic EL layer.

In the present invention, the decomposition removal layer is formed into a pattern on an electrode layer or electric charge injection transportation layer and the decomposition removal layer has different contact angle with liquid from that of an electrode layer or electric charge injection transportation layer located under the decomposition removal layer, therefore, by utilizing this difference in wettability, an EL element having an organic EL layer formed into a highly precise pattern along the pattern of the decomposition removal layer formed into a pattern can be obtained. Further, since an EL element itself does not contain a photocatalyst, and influence by the semi permanent action of a photocatalyst can be avoided.

Further, in the present invention, there is provided an EL element comprising: at least a first electrode layer; a decomposition removal layer which is in the form of pattern on the first electrode layer or an electric charge injection transportation layer formed on the first electrode layer, decomposed and removed by the action of a photocatalyst in irradiation with energy, and has an electric charge shielding property; an organic EL layer which is formed so as to coat the first electrode layer and decomposition removal layer and contains at least a light emitting layer; and a second electrode layer formed on the organic EL layer.

In the present invention, since the decomposition removal layer having an electric charge shielding property is formed on an electrode layer or electric charge injection transportation layer, electric charges from the electrode layer are not injected into an organic EL layer located on the decomposition removal layer even if the organic EL layer is not particularly formed into a pattern, therefore, the same effect can be obtained as in the case of formation of an organic EL layer into a pattern. Since the EL element itself does not contain a photocatalyst, an influence by the semi permanent action of a photocatalyst can be avoided, and a long life can be obtained.

In the invention, it is preferable that the above-mentioned first electrode layer is formed on a base material.

The reason for this is that when an EL element containing the above-mentioned decomposition removal layer does not hold a self supporting property, the strength of the EL element can be improved by forming it on a base material.

According to the present invention, a decomposition removal layer which is decomposed and removed by the action of a photocatalyst in irradiation with energy is formed into a pattern by irradiation with energy via a photocatalyst treatment layer containing a photocatalyst, further, such a decomposition removal layer has different contact angle with liquid from that of an electrode layer when the decomposition removal layer is formed on the electrode layer, or from that of a electric charge injection transportation layer when the decomposition removal layer is formed on the electric charge injection transportation layer, therefore, complicated works and the like are not particularly required, and an organic EL layer in the form of pattern corresponding to the pattern of the decomposition removal layer can be formed by utilizing these wettability differences. Further, since the photocatalyst treatment layer is removed from the decomposition removal layer after patterning of the decomposition removal layer, the photocatalyst treatment layer is not contained in an EL element itself, therefore, there is an effect that there is no need to worry about an influence by the action of a photocatalyst in the photocatalyst treatment layer.

DETAILED DESCRIPTION OF PREFERRED EMBODIMENTS

Figure 1A:
FIGS. 1A, 1B, 1C, 1D and 1E are process views showing one example of the method of producing an EL element of the present invention.
Figure 1A:
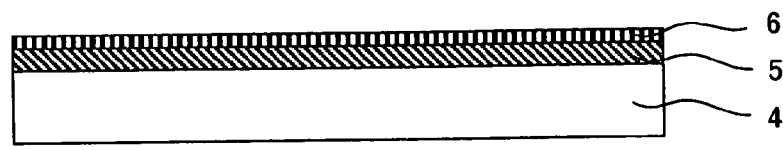

The EL element and its production method of the present invention will be illustrated below. First, the production method will be described.

I. Method of producing EL element

The method of producing an EL element of the present invention is a method in which, for patterning of an organic EL layer, a layer, in which a property changes by the action of a photocatalyst in irradiation with energy is previously formed into a pattern corresponding to the pattern of the organic EL layer, and the patterning of the organic EL layer is conducted by utilizing this layer, in which a property changes, formed into a pattern, to produce an EL element.

In the present invention, as such a layer in which a property changes, various layers in which a property changes can be used, and particularly preferable are a layer in which a wettability changes and a layer to be decomposed and removed, easily enabling formation of an organic EL layer into a highly precise pattern. So, an embodiment using a decomposition removal layer which is decomposed and removed by the action of a photocatalyst in irradiation with energy, and an embodiment using a layer in which a wettability changes will be illustrated separately below. Further, the case using a decomposition removal layer can be classified into a first embodiment in which patterning of an organic EL layer is conducted by utilizing the wettability of a decomposition removal layer formed into a pattern and a second embodiment utilizing a electric charge shielding property of a decomposition removal layer formed into a pattern. On the other hand, the case using a layer in which a wettability changes can be classified into a third embodiment utilizing change in wettability of an electrode layer and a fourth embodiment utilizing change in wettability of an electric charge injection transportation layer. These embodiments will be illustrated in detail below.

(I) First Embodiment

The first embodiment is an embodiment in which a decomposition removal layer is used which is decomposed and removed by the action of a photocatalyst in irradiation with energy, further, in which patterning of an organic EL layer is conducted by utilizing the wettability of such a decomposition removal layer.

The method of producing an EL element in such an embodiment comprises at least a decomposition removal layer forming process of preparing an electrode layer, and forming, on the electrode layer or an electric charge injection transportation layer formed on the electrode layer, a decomposition removal layer which is decomposed and removed by the action of a photocatalyst in irradiation with energy and having a different contact angle with liquid from that of the electrode layer or the electric charge injection transportation layer, a decomposition removal layer patterning process of using a photocatalyst treatment layer substrate having a photocatalyst treatment layer containing a photocatalyst formed on a substrate, and placing the photocatalyst treatment layer and the decomposition removal layer at an interval of 200 μm or less, then, conducting pattern irradiation with energy from predetermined direction so that a region to be decomposed and removed of the decomposition removal layer is irradiated with energy, to form the decomposition removal layer into a pattern, a removing process of removing the photocatalyst treatment layer from the decomposition removal layer, and an organic EL layer forming process of forming an organic EL layer on the electrode layer or electric charge injection transportation layer according to the pattern of the decomposition removal layer.

The decomposition removal layer in this embodiment is formed on an electrode layer in some cases and formed on an electric charge injection transportation layer in other cases. In the case of a decomposition removal layer is formed on an electrode layer, the electrode layer and decomposition removal layer are formed so that they are different in wettability, therefore, an organic EL layer is formed into a pattern along the pattern of the decomposition removal layer utilizing this difference in wettability. On the other hand, in the case of a decomposition removal layer is formed on an electric charge injection transportation layer, an organic EL layer is formed into a pattern in the same manner by forming the electric charge injection transportation layer and decomposition removal layer so that they have different contact angles with liquid.

Further, in this embodiment, a photocatalyst treatment layer containing a photocatalyst is used and a decomposition removal layer is pattern-irradiated with energy via this photocatalyst treatment layer, in forming the decomposition removal layer into a pattern, therefore, the decomposition removal layer containing no photocatalyst can be decomposed and removed by the action of a photocatalyst. Further, since the photocatalyst treatment layer is removed from the decomposition removal layer after completion of patterning of the decomposition removal layer, an EL element itself does not contain the photocatalyst treatment layer and the semi permanent action of a photocatalyst on the EL element can be avoided.

The method of producing an EL element in such an embodiment will be illustrated using a drawing.

FIGS. 1A, 1B, 1C, 1D and 1E show one example of the method of producing an EL element of this embodiment. In this production method, first, a photocatalyst treatment layer substrate 3 comprising a transparent substrate 1 and a photocatalyst treatment layer 2 formed on this transparent substrate 1 is prepared, further, a base material 4 is prepared separately from the photocatalyst treatment layer substrate 3, a first electrode layer 5 is formed on this base material 4, then, a decomposition removal layer 6 is formed on this first electrode layer 5 (see, FIG. 1A).

Figure 1B:
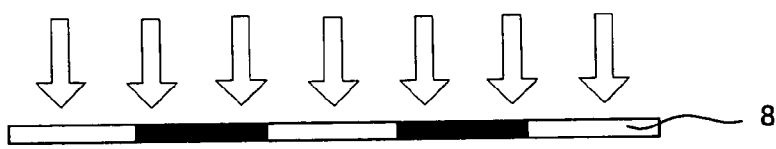
Figure 1B:
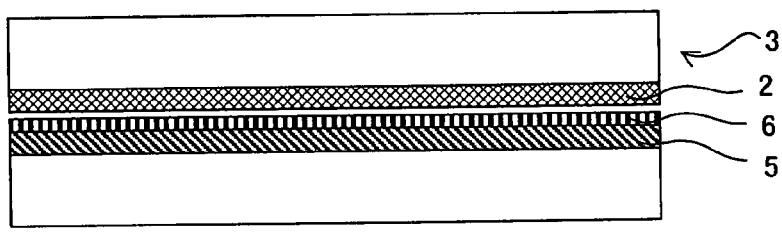

Next, the photocatalyst treatment layer 2 of this photocatalyst treatment layer substrate 3, and the decomposition removal layer 6 are placed so that they face to each other, and irradiated with ultraviolet ray via a photomask 8 (see, FIG. 1B).

By the above-mentioned irradiation with ultraviolet ray, the decomposition removal layer 6 in the ultraviolet irradiation region is decomposed and removed by the action of a photocatalyst contained in the photocatalyst treatment layer 2. Then, by removing (separating) the photocatalyst treatment layer substrate 3 from the decomposition removal layer 6, the decomposition removal layer 6 in the ultraviolet irradiation region is decomposed and removed, to obtain the decomposition removal layer 6 formed into a pattern (see, FIG. 1C).

The decomposition removal layer 6 in this embodiment have different wettability from that of the first electrode layer 5 located under the decomposition removal layer 6, therefore, by utilizing this difference in wettability, the decomposition removal layer 6 is decomposed and removed, and an organic EL layer 9 is formed on a region at which the first electrode layer 5 is exposed.

Figure 1C:
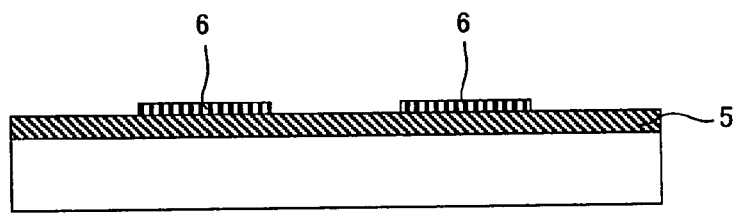
Figure 1D:
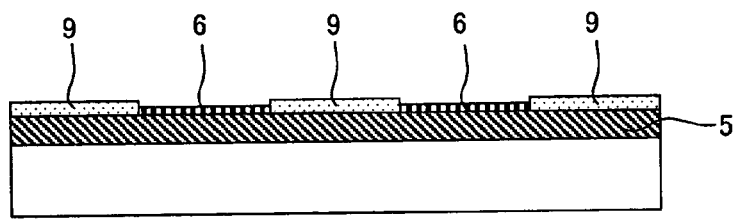
Figure 1E:
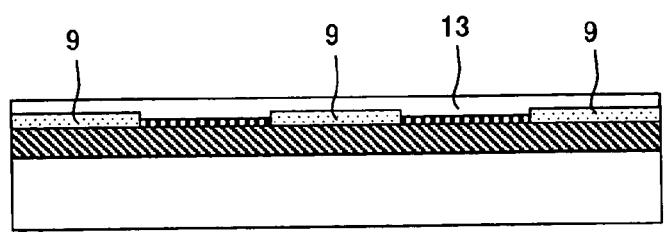

Further, a second electrode layer 13 is formed on an organic EL layer 9 (see, FIG. 1E). By this, when the second electrode layer 13 is, for example, a transparent electrode layer, an EL element which takes light from the upper part in the figure can be obtained.

Regarding such a method of producing an EL element of the present invention, each process will be illustrated in detail.

A. Decomposition Removal Layer Forming Process

The decomposition removal layer forming process in this embodiment is a process in which a decomposition removal layer, which is decomposed and removed by the action of a photocatalyst in irradiation with energy, is formed on an electrode layer or an electric charge injection transportation layer formed on the electrode layer.

Hereinafter, the decomposition removal layer, electrode layer and electric charge injection transportation layer constituting this process will be described.

(1) Decomposition Removal Layer

First, a decomposition removal layer will be described. The decomposition removal layer in this embodiment is a layer of which parts irradiated with energy are decomposed and removed by the action of a photocatalyst in the photocatalyst treatment layer when irradiated with energy, and a layer manifesting different wettability from that of a layer exposed when the decomposition removal layer is decomposed and removed (for example, an electrode layer when a decomposition removal layer is formed on the electrode layer, and a electric charge injection transportation layer when a decomposition removal layer is formed on the electric charge injection transportation layer).

With such a decomposition removal layer, a pattern composed of parts which have a decomposition removal layer and parts which have no decomposition removal layer, namely, a pattern having irregularity can be formed without conducting a developing process or cleaning process, since parts irradiated with energy are decomposed and removed by the action of a photocatalyst.

This decomposition removal layer is decomposed by oxidation and vaporized, and the like by the action of a photocatalyst by irradiation with energy, therefore, removed without special post treatment such as a developing process, cleaning process and the like, and a cleaning process and the like may be conducted depending on the material of the decomposition removal layer.

This embodiment is an embodiment of patterning an organic EL layer by using a decomposition removal layer formed into a pattern and utilizing the wettability of the decomposition removal layer, namely, this embodiment is constituted so that the decomposition removal layer has different contact angle with liquid from that of an electrode layer or electric charge injection transportation layer exposed in decomposition and removal of this decomposition removal layer. The reason for this is that, in this embodiment, an organic EL layer is formed into a pattern by utilizing different wettability of a decomposition removal layer and a layer exposed when the decomposition removal layer is decomposed and removed, after the decomposition removal layer is formed into a desired pattern.

Further, regarding the wettability of a decomposition removal layer, when an organic EL layer is formed on a region exposed by decomposition and removal of a decomposition removal layer, it is preferable that the contact angle of a decomposition removal layer with liquid is larger than the contact angle of a layer located under the decomposition removal layer (for example, an electrode layer when a decomposition removal layer is formed on the electrode layer, and an electric charge injection transportation layer when a decomposition removal layer is formed on the electric charge injection transportation layer) with liquid. The reason for this is that, by this, organic EL layer forming coating solution which forms an organic EL layer scarcely adheres to the surface of a decomposition removal layer, and can successfully adhere to a region on which a decomposition removal layer is not formed.

In such a case, it is preferable that the contact angle of a decomposition removal layer with liquid having surface tension equivalent to the surface tension of organic EL layer forming coating solution to be coated is larger than the contact angle of an electrode layer or electric charge injection transportation layer exposed by decomposition and removal of the decomposition removal layer by 1° or more, particularly 5° or more, especially 10° or more.

In such a case, regarding liquid repellency required for the surface of a decomposition removal layer, it is preferable that the contact angle with liquid having surface tension equivalent to the surface tension of organic EL layer forming coating solution to be coated is 30° or more, particularly 40° or more, especially 50° or more.

On the other hand, when an organic EL layer is formed on a decomposition removal layer, it is preferable that the contact angle with liquid on a decomposition removal layer is smaller than the contact angle of a layer exposed by decomposition and removal of a decomposition removal layer (for example, an electrode layer when a decomposition removal layer is formed on the electrode layer, and an electric charge injection transportation layer when a decomposition removal layer is formed on the electric charge injection transportation layer) with liquid. The reason for this is that, by this, organic EL layer forming coating solution which forms an organic EL layer scarcely adheres to an electrode layer or an electric charge injection transportation layer, and can successfully adhere on a decomposition removal layer.

The contact angle with liquid here referred to is obtained by measuring contact angle with liquid having various surface tensions by a contact angle measuring apparatus (CA-Z type, manufactured by Kyowa Interface Science Co., LTD.) (30 seconds after dropping droplets from a micro syringe), or drawing a graph using the results. In its measurement, wetting index standard solution manufactured by JUNSEI CHEMICAL CO., LTD. was used as the liquid having various surface tensions.

The thickness of a decomposition removal layer in this embodiment is not particularly limited as long as a decomposition removal layer has a thickness which can be decomposed and removed by the action of a photocatalyst in irradiation with energy, in a decomposition removal layer patterning process described later. Specifically, the thickness is preferably from 0.001 µm to 1 µm, particularly preferably from 0.01 to 0.1 µm.

The material which can be used in such a decomposition removal layer is a material having the above-mentioned property of a decomposition removal layer, namely, when irradiated with energy, a material which is decomposed and removed by the action of a photocatalyst contained in a photocatalyst treatment layer placed at predetermined interval from a decomposition removal layer, and preferably, a material having contact angle with liquid in the above-mentioned range. By selecting such a material and using a method of producing to form a functional thin film, namely, a self-assembled monolayer, Langmuir Blodgett film and layer-by-layer self-assembled film, a thin film having relatively high strength can be formed, and an excellent difference in wettability can be formed between a decomposition removal layer and electrode layer, or electric charge injection transportation layer.

The self-assembled monolayer, Langmuir Blodgett film and layer-by-layer self-assembled film used in this embodiment will be illustrated specifically.

1. Self-assembled Monolayer

Though the inventors do not know the presence of the official definition of a self-assembled monolayer, review of "Formation and Structure of Self-Assembled Monolayers", by Abraham Ulman, Chemical Review, 96, 1533–1554 (1996), for example, is excellent as description of which is recognized generally as a self-assembled monolayer. Referring to this review, it can be concluded that the self-assembled monolayer is a single molecule layer obtained as a result of adsorption and bonding (self-assembling) to the surface of a suitable substrate of suitable molecules. As the material having an ability of forming a self-assembled film, for example, surfactant molecules such as fatty acids and the like, organosilicon molecules such as alkyltrichlorosilanes, alkylalkoxides and the like, organic sulfur molecules such as alkanethiols and the like, organic phosphoric acid molecules such as alkylphosphates and the like are listed. The general common property of the molecule structure is that they have a relatively long alkyl chain, and a functional group, which acts mutually with the surface of a substrate, is present on the one end of a molecule. A portion of an alkyl chain is source of intermolecular force when molecules pack tow-dimensionally. However, the example shown here is the most simple structure, and there are reported self-assembled monolayers composed of various molecules such as those having a functional group such as an amino group, carboxyl group and the like on another end of a molecule, those in which a part of an alkylene chain is an oxyethylene chain, those in which a part of an alkylene chain is a fluorocarbon chain, those having a chain of type obtained by combination thereof, and the like. There is also a self-assembled monolayer of composite type composed of a plurality of molecular species. Further, recently, one layer of a polymer in the form of particle and having a plurality of functional groups (there may be only one functional group, in some cases) as typified by a dendrimer, or a linear (in some cases, branched) polymer is formed on the surface of a substrate (the latter is generically called as polymer brush) are considered as a self-assembled monolayer, in some cases. In the present invention, these are also included in the self-assembled monolayer.

2. Langmuir Blodgett Film

The form of the Langmuir Blodgett film used in this embodiment has no significant difference from the above-mentioned self-assembled monolayer, once they are formed on an electrode layer or on an electric charge injection transportation layer. It can be concluded that the feature of the Langmuir Blodgett film resides in its formation method and a high two-dimensional molecule packing property (high alignment property, high order property) derived therefrom. Namely, in general, Langmuir Blodgett film forming molecules are developed first on the gas-liquid interface, and the developed film is condensed by trough to be changed into a highly packed condensed film. Actually, this is transferred onto a suitable base material and used. By the method outlined here, a single molecule film to a multi-layer film made of optional molecule layers can be formed. Not only low weight molecules, but also polymers, colloid particles and the like can be used as the film material. Recent examples using various materials are described in detail in review of Tokuji Miyashita, et at., "Vision of soft type nano-device productionformano-technology", POLYMER, vol. 50, no. 9, 644–647 (2001).

3. Layer-by-Layer Self-assembled Film

The layer-by-layer self-assembled film is, in general, a film formed by laminating by adsorption and bonding of materials having a functional group with at least two positive or negative charges sequentially on a base material. Since a material having a lot of functional groups has a lot of merits such as increase in the strength and durability of a film, and the like, ionic polymers (polymer electrolyte) are recently used as the material in many cases. Particles having a surface charge such as proteins, metals, oxides and the like, what is called "colloid particles" are also used as the film formation substance frequently. Further recently, there are also reports on films positively utilizing mutual action weaker than ionic bond such as hydrogen bond, coordinate bond, hydrophobic mutual action and the like. Examples of the layer-by-layer self-assembled film found relatively recently are described in detail in review of Paula T. Hammond, "Recent Explorations in Electrostatic Multilayer Thin Film Assembly", Current Opinion in Colloid & Interface Science, 4, 430–442 (2000), though they are somewhat biased to materials in which electrostatic mutual action is utilized as driving force. Exemplified using a simplest process, the layer-by-layer self-assembled film is a film formed by repeating, predetermined times, a cycle of adsorption of a material having a positive (negative) charge-cleaning-adsorption of a material having a positive (negative) charge-cleaning. An operation of development-condensation-transfer like in the case of a Langmuir Blodgett film is not necessary at all. As apparent from a difference between these production methods, the layer-by-layer self-assembled film does not have, in general, two-dimensional high alignment property and high order property as in the Langmuir Blodgett film. However, the layer-by-layer self-assembled film and its formation method have a lot of merits not found in conventional film formation methods, such as easy formation of a dense film without defect, uniform film formation even on a fine irregular surface, inner surface of tube, spherical surface and the like.

In a decomposition removal layer formed of such material, when an organic EL layer described later is formed on a decomposition removal layer, materials having an electric charge injection and transportation property are preferable because of necessity of injection of electric charges into the organic EL layer.

(2) Electrode Layer

In this embodiment, the above-mentioned decomposition removal layer is formed on an electrode layer, in some cases. The material of forming this electrode layer is not particularly limited as long as it is a material having conductivity. As such material, for example, In—Zn—O (IZO), In—Sn—O (ITO), ZnO—Al, Zn—Sn—O and the like are preferable since those having transparency are preferable when in the EL element shown in FIG. 1E, light is taken from the lower part in the figure, and when, in a decomposition removal layer patterning process described later, the layer is irradiated with energy from the lower part in FIG. 1B. On the other hand, when, in the EL element shown in FIG. 1E, light is taken from the upper part in the figure, it is also possible to use an electrode made of a metal since transparency is not particularly required. Specifically, Au, Ta, W, Pt, Ni, Pd, Cr and Al alloy, Ni alloy, Cr alloy and the like are listed.

(3) Electric Charge Injection Transportation Layer

Next, the electric charge injection transportation layer will be illustrated.

In the embodiment, when an electric charge injection transportation layer is formed on the above-mentioned electrode layer, it is also possible to form a decomposition removal layer on the electric charge injection transportation layer. When a decomposition removal layer is thus provided on an electric charge injection transportation layer, an organic EL layer is formed on an electric charge injection transportation layer by utilizing a decomposition removal layer formed into a pattern, and in this case, the organic EL layer becomes, in general, a light emitting layer. The electric charge injection transportation layer here referred to has a function of stably transporting electric charges from an electrode to an organic EL layer described later, and by providing such an electric charge injection transportation layer between a light emitting layer and an electrode layer, injection of electric charges into a light emitting layer is stabilized, and light emitting efficiency can be enhanced.

Such an electric charge injection transportation layer includes a hole injection transportation layer which injects holes stably into an organic EL layer and transports holes, and an electron injection transportation layer which injects electrons stably into an organic EL layer and transports electrons. In this embodiment, the above-mentioned electrode layer is, in general, often an anode, therefore, the electric charge injection transportation layer formed on such an electrode is a hole injection transportation layer.

A hole injection transportation layer and an electron injection transportation layer as the electric charge injection transportation layer will be illustrated below.

1. Hole Injection Transportation Layer

The hole injection transportation layer in this embodiment is not particularly limited as long as it is a layer capable of transporting holes injected from an anode into a light emitting layer. For example, either a hole injection layer having a function of stably injecting holes, injected from an anode, into a light emitting layer, or a hole transportation layer having a function of transporting holes, injected from an anode, into a light emitting layer, or a combination thereof, and a layer having both functions may also be used.

Further, the thickness of a hole injection transportation layer is not particularly limited as long as it is thickness at which its function is sufficiently manifested, and it is preferable that the thickness is in a range of 10 nm to 300 nm, particularly from 30 nm to 100 nm.

The material of such a hole injection transportation layer is not particularly limited as long as it is a material which stably transports holes, injected from an anode, to a light emitting layer. Specifically, N-(1-naphthyl)-N-phenylbenzine (α-NPD), 4,4,4-tris (3-methylphenylphenylamino) triphenylamine (MTDATA), further, listed as the material having higher molecular weigh are polyvinylcarbazole (PVCs), poly-3,4-ethylenedioxythiophene (PEDOT), polyphenylenevinylene derivative, polyaniline and the like are listed.

2. Electron Injection Transportation Layer

Next, the electron injection transportation layer will be illustrated. The electron injection transportation layer in this embodiment may be either an electron injection layer having a function of stably injecting electrons, injected from a cathode, into a light emitting layer, an electron transportation layer having a function of transporting electrons into a light emitting layer, a combination thereof, or a single layer having both functions.

First, the electron injection layer will be described. The material forming an electron injection layer is not particularly limited as long as it is a material capable of stabilizing injection of electrons into a light emitting layer. Listed as such materials are single bodies of alkaline earth metals such as Ca, Ba and the like, oxides or fluorides of alkali metals or alkaline earth metals. Of them, fluorides of alkaline earth metals are preferable. The reason for this is that fluorides of alkaline earth metals have high melting point and can improved heat resistance. Specifically, $MgF_2$, $CaF_2$, $SrF_2$, $BaF_2$, LiF and the like are listed. It is also possible to laminate them in use such as Ca/LiF. The thickness of an electron injection layer made of such a material is preferably in a range of 0.2 nm to 10 nm.

Further, in the case of use of a transparent oxide conductive material such as an indium oxide as a cathode, the work function thereof is 4.6 eV or more, therefore, it is preferable to form an electron injection layer using a material having a work function of 4.0 eV or less. The reason for this is that, under low driving voltage, it is difficult to inject electrons from a cathode formed of an indium oxide having a work function of 4.6 eV or more directly into a light emitting layer, however, by providing an electron injection layer having a work function of 4.0 eV or less between these layers, injection of electrons becomes easy. Specifically, Ba, Ca, Li, Cs, Mg and the like are listed. In the case of formation of an electron injection layer with such a material, it is preferable that the thickness is in a range of 0.2 nm to 50 nm, particularly from 0.2 nm to 20 nm. The reason for this is that a transparent oxide conductive material is used as a cathode in this case, transparency is required also for an electron injection layer when deriving light from this cathode side.

In general, it is difficult to strictly discriminate an electron injection layer and a cathode, therefore, the above-mentioned materials used in an electron injection layer are laminated and used as a cathode having also a function as an electron injection layer. In such a case, Al, Ag and the like can be used as the material of a cathode.

Next, the material forming an electron transportation layer is not particularly limited as long as it is a material capable of transporting electrons injected from the above-mentioned electron injection layer or cathode into a light emitting layer. In general, in the case of polymer organic EL, by providing an electron transportation layer having low molecular weight in between a light emitting layer or electron injection layer and a cathode by a method such as vapor deposition and the like, there is a possibility of improvement in an ability owing to a hole block effect. In the present invention, as the material forming an electron transportation layer or a layer performing a hole block effect, electron transporting compounds such as BCP (basocupron) or Bpehn (basophenanetroline) and the like are listed.

In the case of a layer having both of a function as an electron injection layer and a function as an electron transportation layer, by mixing an alkali metal or alkaline earth metal as a dope material with an organic material having an electron transporting property, electrons can be stably injected into a light emitting layer and transported. Listed as such a metal dope material are Li, Cs, Ba, Sr and the like. In this case, it is preferable that the molar ratio of an electron transporting organic material to a metal dope material is in a range of 1:1 to 1:3, particularly from 1:1 to 1:2. Further, it is preferable that the thickness in this case is in a range of 5 nm to 1000 nm, particularly from 10 nm to 100 nm. The reason for this is that, by adding a metal dope material, electron mobility increases, and transmittance is higher in comparison with a metal single body.

(4) Base Material

In this embodiment, it is preferable to form an EL element on a base material from the standpoints of the self supporting property of an electrode layer and decomposition removal layer and the strength of an EL element.

The term self supporting property referred to in this embodiment means a capability of existence in tangible condition without other supporting material.

It is preferable that such a substrate is transparent in the case of deriving light from the lower direction in the EL element shown in FIG. 1E, or in the case of irradiation with energy from the lower direction of FIG. 1B in a decomposition removal layer patterning process described later. Specifically, quarts, glass and the like are listed. In the EL element shown in FIG. 1E, when light is derived from the upper direction, transparency is not particularly required, therefore, in addition to the above-mentioned material, metals such as aluminum, alloys thereof and the like, plastics, woven fabrics, non-woven fabrics and the like can be listed.

B. Decomposition Removal Layer Patterning Process

The decomposition removal layer patterning process in this embodiment is a process of using a photocatalyst treatment layer substrate having a photocatalyst treatment layer containing a photocatalyst formed on a substrate, and placing the above-mentioned photocatalyst treatment layer and the above-mentioned decomposition removal layer at an interval of 200 μm or less, then, conducting pattern irradiation with energy from predetermined direction so that a region to be decomposed and removed of the above-mentioned decomposition removal layer is irradiated with energy, to form the above-mentioned decomposition removal layer into a pattern.

The photocatalyst treatment layer substrate and the like used in this process as described above will be described below.

The photocatalyst treatment layer substrate described below is used also in the second, third and fourth embodiments in addition to this embodiment. Then, for allowing the photocatalyst treatment layer substrate described below to correspond to all embodiments of the present invention, a decomposition removal layer or a layer in which wettability changes are generically described as a property variable layer in some cases.

(1) Photocatalyst Treatment Layer Substrate

In the present invention, when patterning a property variable layer in which a property changes by the action of a photocatalyst in irradiation with energy, a photocatalyst treatment layer substrate having a photocatalyst treatment layer containing a photocatalyst formed thereon is used for exerting the action of a photocatalyst on a property variable layer. A property variable layer can be patterned by placing such a photocatalyst treatment layer substrate on a property variable layer at predetermined interval and conducting pattern irradiation with energy.

Such a photocatalyst treatment layer substrate has at least a photocatalyst treatment layer and a substrate, and usually, a photocatalyst treatment layer in the form of thin film is formed by a predetermined method on a substrate. As this photocatalyst treatment layer substrate, those having a light shielding part in the form of pattern can be used.

1. Photocatalyst Treatment Layer

The photocatalyst treatment layer used in the present invention is not particularly limited as long as a photocatalyst in the photocatalyst treatment layer changes the property of the intended property variable layer, and the photocatalyst treatment layer may be constituted of a photocatalyst and a binder, or may be formed of a photocatalyst alone. The wettability of it surface may be lyophilic or liquid-repellent.

Figure 5:
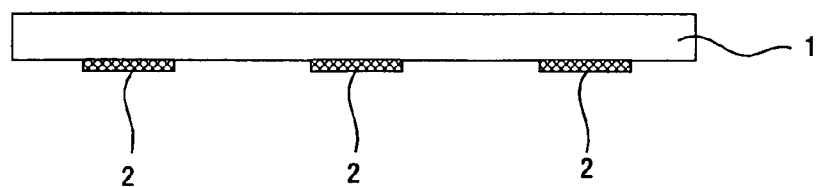
FIG. 5 is a schematic sectional view showing one example of a photocatalyst treatment layer in the present invention.

The photocatalyst treatment layer used in the present invention may be formed on the whole surface of a substrate 1 as shown, for example, in the above-mentioned FIG. 1A and the like, or the photocatalyst treatment layer 2 may be formed into a pattern on a substrate 1 as shown, for example, in FIG. 5.

By thus forming a photocatalyst treatment layer in to a pattern, there is no need to conduct pattern irradiation using a photomask and the like in placing a photocatalyst treatment layer at predetermined interval from a property variable layer and irradiating the layer with energy, and by irradiating the whole surface, the property of a property variable layer can be changed.

This patterning method of a photocatalyst treatment layer is not particularly limited, and for example, can be conducted by a photolithography method and the like.

Since the property only on a property variable layer actually facing a photocatalyst treatment layer changes, energy irradiation may be conducted from any direction as long as parts at which the above-mentioned photocatalyst treatment layer and property variable layer face are irradiated with energy, further, there is a merit that irradiation energy is not particularly limited to parallel energies such as parallel light and the like.

The action mechanism of a photocatalyst typified by titanium dioxide described later in such a photocatalyst treatment layer is not necessarily clear, however, it is believed that a carrier produced by irradiation with light changes the chemical structure of an organic substance by a direct reaction with adjacent compounds or by an active oxygen species produced in the presence of oxygen and water. In the present invention, it is believed that this carrier exerts an action on a compound in a property variable layer placed near a photocatalyst treatment layer.

As the photocatalyst used in the present invention, those known as a photo-semiconductor, for example, titanium dioxide ($TiO_2$), zinc oxide (ZnO), stannic oxide ($SnO_2$), strontium titanate ($SrTiO_3$), tungsten oxide ($WO_3$), bismuth oxide ($Bi_2O_3$) and iron oxide ($Fe_2O_3$) are listed, and one kind or two or more kinds of compounds can be selected from them and used in admixture.

In the present invention, particularly titanium dioxide is suitably used since it shows high band gap energy, is chemically stable and non-toxic, and easily available. Titanium dioxide includes anatase type and rutile type and both of them can be used in the present invention, and anatase type titanium dioxide is preferable. The anatase type titanium dioxide has an excitation wavelength of 380 nm or less.

As such anatase type titanium dioxide, for example, anatase type titania sol of hydrochloric acid peptisation type (STS-02 (average particle size: 7 nm) manufactured by Ishihara Sangyo Kaisha, Ltd., ST-K01 manufactured by Ishihara Sangyo Kaisha, Ltd.), anatase type titania sol of nitric acid peptisation type (TA-15 (average particle size: 12 nm) manufactured by Nissan Chemical Industries, Ltd.) and the like are listed.

Smaller the particle size of a photocatalyst is, it is preferable since a photocatalyst reaction occurs effectively, and the average particle size thereof is preferably 50 nm or less, and it is particularly preferable to use a photocatalyst having an average particle size of 20 nm or less.

The photocatalyst treatment layer in the present invention may be formed of a photocatalyst alone as described above, or may be formed by mixing with a binder.

In the case of a photocatalyst treatment layer is made only of a photocatalyst, the efficiency of a change in a property on a property variable layer is improved, being advantageous from the standpoint of cost such as shortening of treatment time, and the like. On the other hand, in the case of a photocatalyst treatment layer is made of a photocatalyst and a binder, there is a merit that formation of a photocatalyst treatment layer is easy.

As the method of forming a photocatalyst treatment layer made only of a photocatalyst, vacuum film formation methods such as, for example, a sputtering method, CVD method, vacuum vapor deposition method and the like are listed. By forming a photocatalyst treatment layer by a vacuum film formation method, a photocatalyst in the form of uniform film and containing only a photocatalyst can be obtained, and by this, a property on a property variable layer can be changed uniformly, and since it is made only of a photocatalyst, a property on a property variable layer can be changed relatively efficiently as compared with the case using a binder.

As the method of forming a photocatalyst treatment layer made only of a photocatalyst, when the photocatalyst is titanium dioxide for example, mentioned are a method in which amorphous titania is formed on a substrate, then, it is phase-changed into crystalline titania by calcination, and other methods. The amorphous titania used here can be obtained by, for example, hydrolysis and dehydration condensation of inorganic salts of titanium such as titanium tetrachloride, titanium sulfate and the like, and hydrolysis and dehydration condensation of organic titanium compounds in the presence of an acid such as tetraethoxytitanium, tetraisopropoxytitanium, tetra-n-propoxytitanium, tetrabutoxytitanium, tetramethoxytitanium and the like. Next, it can be denatured into anatase type titania by calcination at 400 to 500° C., an into rutile type titania by calcination at 600 to 700° C.

When a binder is used, those showing high bonding energy so that the main skeleton of a binder is not decomposed by light-excitation of the above-mentioned photocatalyst are preferable, and for example, organopolysiloxanes and the like are mentioned.

When an organopolysiloxane is used as a binder as described above, the above-mentioned photocatalyst treatment layer can be formed by dispersing a photocatalyst and organopolysiloxane as a binder, if necessary, together with other additives into a solvent to prepare coating solution, and coating this coating solution on a substrate. The solvent used is preferably an alcohol-type organic solvent such as ethanol, isopropanol and the like. Coating can be conducted by a known coating method such as spin coat, spray coat, dip coat, roll coat, bead coat and the like. When a component of ultraviolet-curing type is contained as a binder, a photocatalyst treatment layer can be formed by conducting a curing treatment by irradiating with ultraviolet ray.

As the binder, an amorphous silica precursor can be used. This amorphous silica precursor is represented by the general formula $SiX_4$, and silicon compounds in which X represents a halogen, methoxy group, ethoxy group or acetyl group and the like, silanols which are hydrolyzates thereof, and polysiloxanes having an average molecular weight of 3000 or less, are preferable Specifically, tetraethoxysilane, tetraisopropoxysilane, tetra-n-propoxysilane, tetrabutoxysilane, tetramethoxysilane and the like are listed. In this case, a photocatalyst treatment layer can be formed by uniformly dispersing a precursor of amorphous silica and particles of a photocatalyst in a non-aqueous solvent, hydrolyzing them with water in air to form a silanol on a substrate, then, dehydration-polycondensing it at normal temperature. When the dehydration-polycondensation of a silanol is conducted at 100° C. or more, the degree of polymerization of a silanol can be increased, and the strength of the surface of a film can be improved. These binding agents can be used alone or in admixture of two or more kinds.

The content of a photocatalyst in a photocatalyst treatment layer when a binder is used can be set in a range of 5 to 60 wt %, preferably from 20 to 40 wt %. The thickness of a photocatalyst treatment layer is preferably in a range of 0.05 to 10 μm.

The photocatalyst treatment layer can contain a surfactant in addition to the above-mentioned photocatalysts and binders. Specifically, hydrocarbon-based surfactants such as NIKKOL BL, BC, BO, BB series manufactured by Nikko Chemicals Co., Ltd., fluorine-based or silicone-based nonionic surfactants such as ZONYL FSN, FSO manufactured by Du Pont Kabushiki Kaisha, Surflon S-141, 145 manufactured by Asahi Glass Company, Megafack F-141, 144 manufactured by Dainippon Ink and Chemicals, Incorporated, Futargent F-200, F251 manufactured by Neos, Unidyne DS-401, 402 manufactured by DAIKIN INDUSTRIES, Ltd., Ltd., Fluorad FC-170, 176 of 3M K.K. and the like are listed, and cationic surfactants, anionic surfactants and ampholytic surfactants can be also used.

Further, the photocatalyst treatment layer can contain oligomers, polymers and the like of polyvinyl alcohol, unsaturated polyesters, acrylic resins, polyethylene, diallyl phthalate, ethylene propylene diene monomer, epoxy resins, phenol resins, polyurethane, melanine resins, polycarbonates, polyvinyl chloride, polyamides, polyimides, styrene butadiene rubber, chloroprene rubber, polypropylene, polybutylene, polystyrene, polyvinyl acetate, polyesters, polybutadiene, polybenzimidazole, polyacrylonitrile, epichlorohydrin, polysulfide, polyisoprene and the like, in addition to the above-mentioned surfactants.

2. Substrate

In the present invention, the photocatalyst treatment layer substrate has at least a substrate and a photocatalyst treatment layer formed on this substrate.

In this case, the transparency of a material constituting a substrate used is appropriately selected depending on the direction of irradiation with energy, and the direction of deriving light from the resulting EL element, described later.

Namely, when the EL element shown in FIG. 1E is an EL element from the upper direction of which light is derived and the lower side of the EL element shown in FIG. 1E is non-transparent, the energy irradiation direction is necessarily from the side of a photocatalyst treatment layer substrate, and as shown in FIG. 1B, it is necessary to place a photomask 7 on the side of a photocatalyst treatment layer substrate 3 and irradiate it with energy. Further, also when a light shielding part is previously formed into the predetermined pattern on a photocatalyst treatment layer substrate and a pattern is formed by using this light shielding part as described later, it is necessary to conduct irradiation with energy from the photocatalyst treatment layer substrate side. In such a case, it is necessary that the substrate has transparency.

On the other hand, when the EL element shown in FIG. 1E is of type in which light is derived from the lower direction and the lower side of the EL element shown in FIG. 1E is transparent, it is possible to place a photomask on the base material 4 side and to conduct energy irradiation, therefore, in such as case, the substrate is not required to be transparent.

The substrate used in the present invention may have flexibility, or for example, may be a resin film and the like, or may have no flexibility, for example, a glass substrate and the like.

As described above, the material of the substrate used in a photocatalyst treatment layer substrate in the present invention is not particularly limited, however, in the present invention, this photocatalyst treatment layer substrate is used repeatedly, therefore, a material having predetermined strength and having a surface excellent in close-adherence with a photocatalyst treatment layer is suitably used.

Specifically, glass, ceramics, metals, plastics and the like are listed.

For improving the close-adherence of the surface of a substrate with a photocatalyst treatment layer, it may also be permissible that an anchor layer is formed on a substrate. As such an anchor layer, for example, silane-based, titanium-based coupling agents, and the like are listed.

3. Light Shielding Part

As the photocatalyst treatment layer substrate used in the present invention, the one which has a light shielding part formed into a pattern may also be used. By using a photocatalyst treatment layer substrate having such a light shielding part, it is not necessary to use a photomask, and to conduct drawing-irradiation with laser light, in energy irradiation. Therefore, since positioning of a photocatalyst treatment layer substrate with a photomask is not necessary, the process can be simplified, and since an expensive apparatus necessary for drawing-irradiation is also not necessary, there is a merit of advantage in cost.

The photocatalyst treatment layer substrate having such a light shielding part can include the following two embodiments depending on the formation position of the light shielding part.

Figure 6:
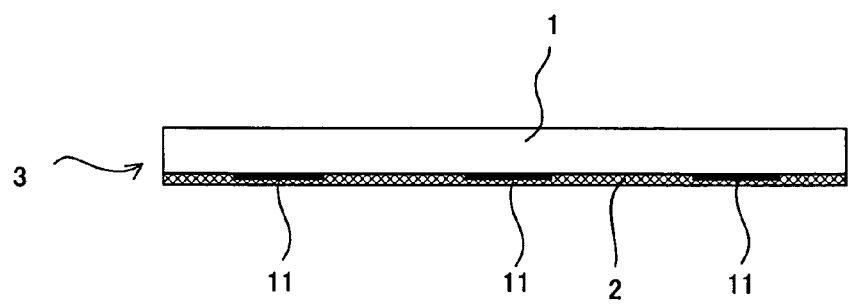
FIG. 6 is a schematic sectional view showing another example of a photocatalyst treatment layer in the present invention.
Figure 7:
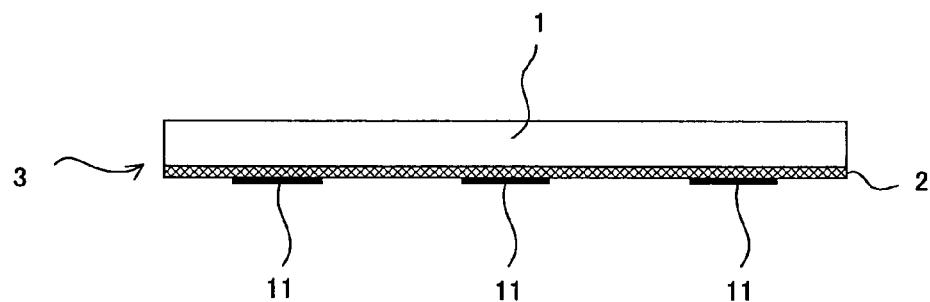
FIG. 7 is a schematic sectional view showing another example of a photocatalyst treatment layer in the present invention.

One is an embodiment in which, as shown in FIG. 6 for example, a light shielding part 11 is formed on a substrate 1, and a photocatalyst treatment layer 2 is formed on this light shielding part 11, to give a photocatalyst treatment layer substrate 3. Another is an embodiment in which, as shown in FIG. 7 for example, a photocatalyst treatment layer 2 is formed on a substrate 1, and a light shielding part 11 is formed thereon, to give a photocatalyst treatment layer substrate 3.

In either embodiment, since a light shielding part is placed near a part at which the above-mentioned photocatalyst treatment layer and property variable layer are placed at an interval as compared with the case of using a photomask, an influence by scattering of energy in the substrate and the like can be decreased, therefore, pattern irradiation with energy can be conducted extremely precisely.

Further, in an embodiment in which a light shielding part is formed on the above-mentioned photocatalyst treatment layer, in placing a photocatalyst treatment layer and a property variable layer at predetermined gap, by allowing the thickness of the light shielding part to coincide with this gap, there is a merit that the above-mentioned light shielding part can be used as a spacer to make the above-mentioned gap constant.

Namely, in placing the above-mentioned photocatalyst treatment layer and property variable layer at predetermined gap, by placing the above-mentioned light shielding part and property variable layer in close-adherence condition, the above-mentioned predetermined gap can be correct, and by conducting energy irradiation from a photocatalyst treatment layer substrate in this condition, a pattern can be formed with high precision on the property variable layer.

Such a light shielding part formation method is not particularly limited, and is appropriately selected and used depending on the property of the light shielding part formation surface, necessary shielding property against energy, and the like.

For example, the light shielding part may also be formed by forming a thin film of a metal such as chromium and the like having a thickness of about 1000 to 2000 Å by a sputtering method, vacuum vapor deposition method and the like, and patterning this thin film. As this patterning method, a usual patterning method such as sputter and the like can be used.

It may also be a method in which a layer prepared by allowing a resin binder to contain light shielding particles such as carbon fine particles, metal oxides, inorganic pigments, organic pigments and the like is formed into a pattern. As the resin binder, there can be used a mixture of one kind or two or more kinds of resins such as polyimide resins, acrylic resins, epoxy resins, polyacrylamides, polyvinyl alcohol, gelatin, casein, cellulose and the like, a photosensitive resin, further, O/W emulsion type resin composition, for example, that obtained by emulsifying a reaction silicone, and the like. The thickness of such a resin light shielding part can be set within a range of 0.5 to 10 μm. As such a resin light shielding part patterning method, methods generally used such as a photolithography method, printing method and the like can be used.

In the above-mentioned illustrations, two cases of the light shielding part formation position of between a substrate and a photocatalyst treatment layer and at the surface of a photocatalyst treatment layer have been described, and additionally, it is also possible to adopt an embodiment in which a light shielding part is formed on the side of surface of a substrate on which a photocatalyst treatment layer is not formed. In this embodiment, there are, for example, a case in which a photomask is closely-adhered to this surface to a releasable extent, and other cases, and these cases can be used suitable when a pattern formed body is changed at small lot.

4. Primer Layer

In the present invention, in the case of forming a light shielding part into a pattern on a substrate as described above and forming a photocatalyst treatment layer on this to give a photocatalyst treatment layer substrate, it is preferable to form a primer layer in between the above-mentioned light shielding part and photocatalyst treatment layer.

Though the action and function of this primer layer are not necessarily clear, it is supposed that, by formation of a primer layer in between a light shielding part and a photocatalyst treatment layer, the primer layer performs a function of preventing diffusion of impurities from an aperture present in between light shielding parts and from a light shielding part which is a cause of disturbing change of the property of a property variable layer by the action of a photocatalyst, particularly, impurities such as a residue generating in patterning of a light shielding part, metals, metal ions and the like. Therefore, by forming a primer layer, a treatment of change in a property progresses at high sensitivity, and resultantly, a pattern of high resolution can be obtained.

In the present invention, the primer layer prevents the influence of impurities present not only at a light shielding part but also at an aperture formed between light shielding parts on the action of a photocatalyst, therefore, it is preferable that the primer layer is formed on the whole surface of a light shielding part including an aperture.

Figure 8:
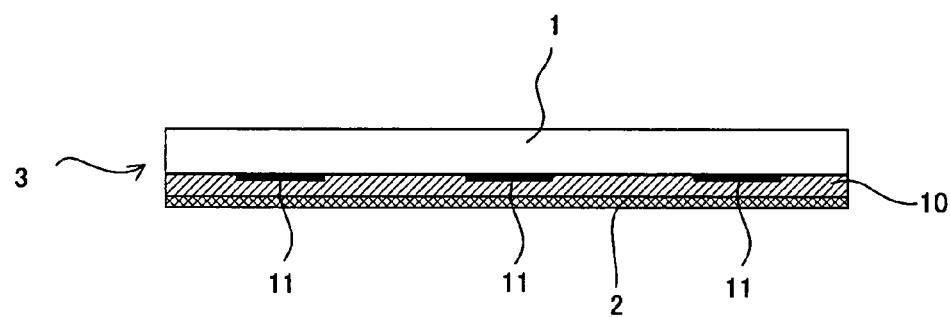
FIG. 8 is a schematic sectional view showing another example of a photocatalyst treatment layer in the present invention.

FIG. 8 shows one example of a photocatalyst treatment layer substrate having such a primer layer formed. A primer layer 10 is formed on the surface of the light shielding part 11 formed side of a substrate 1 with a light shielding part 11, and a photocatalyst treatment layer 2 is formed on the surface of this primer layer 10.

The above-mentioned constitution in which a light shielding part is formed into a pattern on a substrate is a constitution of a general photomask. Therefore, it can be concluded that this primer layer is obtained by forming a photocatalyst treatment layer on a photomask via a primer layer.

The primer layer in the present invention is not particularly limited as long as it has a constitution in which a photocatalyst treatment layer and a photomask are placed so as not to contact physically. Namely, a primer layer has to be formed so that a light shielding part of a photomask and a photocatalyst treatment layer do not contact.

The material constituting this primer layer is not particularly limited, however, an inorganic material which is not easily decomposed by the action of a photocatalyst is preferable. Specifically listed is amorphous silica. When such amorphous silica is used, this amorphous silica precursor is a silicon compound of the general formula $SiX_4$ in which X represents a halogen, methoxy group, ethoxy group or acetyl group and the like, and silanols which are hydrolyzates of these silicon compounds, and polysiloxanes having an average molecular weight of 3000 or less, are preferable.

The thickness of the primer layer is preferably in a range of 0.001 µm to 1 µm, particularly preferably in a range of 0.001 µm to 0.1 µm.

(2) Placing of Photocatalyst Treatment Layer and Property Variable Layer (Decomposition Removal Layer or Layer in which a Wettability Changes)

In this embodiment, a photocatalyst treatment layer and a property variable layer of the above-mentioned photocatalyst treatment layer substrate are placed at a gap of 200 µm or less, then, energy irradiation is conducted from predetermined direction, a pattern of change in a property is formed on the property variable layer. For example, when the property variable layer is a decomposition removal layer described above, a pattern of the presence and absence of the decomposition removal layer is formed, and in a layer in which wettability changes described later, a pattern of a difference in wettability is formed. The gap of 200 µm or less includes also a condition in which a photocatalyst treatment layer and a property variable layer are in contact.

By thus placing a photocatalyst treatment layer and the surface of a property variable layer in separation at predetermined interval, an active oxygen species generated from oxygen, water and a photocatalyst action is easily released. Namely, when placed in separation at larger interval than the above-mentioned range, the generated active oxygen species does not easily reach the property variable layer, and there occurs a possibility that speed of changing in a property is delayed. Therefore, such a case is not preferable. In contrast, when the interval of a photocatalyst treatment layer and a property variable layer is too narrow, an active oxygen species generated from oxygen, water and a photocatalyst action is not easily released, and resultantly, there occurs a possibility that speed of changing in a property is delayed. Therefore, such a case is not preferable.

It is preferable that the above-mentioned interval in the present invention is particularly in a range of 0.2 µm to 10 µm, preferably in a range of 1 µm to 5 µm in view that pattern precision is extremely excellent, the sensitivity of a photocatalyst is high, and consequently, efficiency of change in a property is excellent.

On the other hand, when an EL element having a large area such as, for example, 300 mm×300 mm is produced, it is extremely difficult to provide fine gap as described above in between a photocatalyst treatment layer substrate and a property variable layer. Therefore, when an EL element of relatively large area is produced, it is preferable that the above-mentioned gap is in a range of 10 to 100 µm, particularly in a range of 50 to 75 µm. The reason for this is that, by setting the gap in such a range, a problem of decrease in pattern precision such as diffusion of a pattern and the like, and a problem of deterioration of the sensitivity of a photocatalyst to decrease efficiency of property change, and the like, are not caused.

In irradiating an EL element having such relatively large area with energy, it is preferable that the setting of the gap in an apparatus of positioning a photocatalyst treatment layer substrate and a property variable layer of an energy irradiation apparatus is set in a range of 10 µm to 200 µm, particularly in a range of 25 µm to 75 µm. The reason for this is that, by setting the value in such a range, a photocatalyst treatment layer substrate and a property variable layer can be placed without inviting significant decrease in pattern precision or significant deterioration of the sensitivity of a photocatalyst and without causing contact of the photocatalyst treatment layer substrate and property variable layer.

In the present invention, placing condition at such gap may be maintained at least during irradiation with energy.

As the method of uniformly forming such extremely narrow gap and placing a photocatalyst treatment layer and a property variable layer, for example, a method of using a spacer is mentioned. By using a spacer as described above, uniform gap can be formed, and since at a part to which this space contacts, the action of a photocatalyst is not exerted to the surface of a property variable layer, by allowing this spacer to have the same pattern as that described above, a predetermined pattern can be formed on a property variable layer.

In the present invention, such a spacer can be formed as one member, however, it is preferable to form the spacer on the surface of a photocatalyst treatment layer of a photocatalyst treatment layer substrate as described in the above-mentioned column of "Photocatalyst treatment layer substrate", for simplification of the process and the like. In the above-mentioned item of "Photocatalyst treatment layer substrate", the spacer is illustrated as a light shielding part, however, in this embodiment, since such a spacer may advantageously have an action of protecting the surface so that the action of a photocatalyst is not exerted on the surface of a property variable layer, it may be formed of a material having no function of shielding irradiated energy.

(3) Energy Irradiation

Next, irradiation with energy will be described. Irradiation with energy to a part, which a photocatalyst treatment layer and a property variable layer are facing to each other, is conducted under condition of maintaining the above-mentioned contact condition.

Usually, the wavelength of light used in irradiation with energy is set at 400 nm or less, preferably 380 nm or less. The reason for this is that the preferable photocatalyst used in a photocatalyst treatment layer as described above is titanium dioxide, and light having the above-mentioned wavelength is preferable as energy to activate the action of a photocatalyst with this titanium dioxide.

As the light source which can be used in such energy irradiation, a mercury lamp, metal halide lamp, xenon lamp, excimer lamp, and other various light sources are listed.

In addition to methods of conducting pattern irradiation via a photomask using the above-mentioned light source, methods of conducting drawing-irradiation in the form of pattern using lasers such as excimer, YAG and the like can also be used.

The dose of energy in irradiation with energy is a dose necessary for causing a change in the property of the surface of a property variable layer by the action of a photocatalyst in a photocatalyst treatment layer.

In this operation, conducting irradiation with energy while heating a photocatalyst treatment layer is preferable in that sensitivity can be increased and a property can be efficiently changed. Specifically, it is preferable to heat in a range of 30° C. to 80° C.

The energy irradiation direction in the present invention is determined by a pattern formation method such as formation or not formation of a light shielding part on a photocatalyst treatment layer substrate, or by direction of deriving light from a photocatalyst treatment layer substrate or an EL element, and the like.

Namely, when a light shielding part is formed on a photocatalyst treatment layer substrate, energy irradiation needs to be conducted from the photocatalyst treatment layer substrate side, and in this case, the photocatalyst treatment layer substrate needs to be transparent. In this case, even when a light shielding part is formed on a photocatalyst treatment layer and this light shielding part on the photocatalyst treatment layer side is used to show a function as a spacer, the energy irradiation direction may be from the photocatalyst treatment layer substrate side or from the EL element side.

Energy irradiation direction, in the case of a photocatalyst treatment layer is formed into a pattern, may be conducted from any direction as long as a part at which a photocatalyst treatment layer and a property variable layer contact is irradiated with energy, as described above.

Likewise, also when the above-mentioned spacer is used, irradiation may be conducted from any direction as long as the contact part is irradiated with energy.

When a photomask is used, irradiation with energy is conducted from the side at which a photomask is placed. In this case, it is necessary that the side at which a photomask is placed is transparent.

The irradiation with energy as described above is completed, a photocatalyst treatment layer substrate is separated from a position facing to a property variable layer, and for example, by this, a decomposition removal layer formed into a pattern as shown in FIG. 1C can be obtained.

In this embodiment, patterning of an organic EL layer is conducted using a decomposition removal layer, and in this process, a region irradiated with energy on this decomposition removal layer is decomposed and removed by the action of a photocatalyst and a pattern of the presence or absence of a decomposition removal layer is formed.

C. Removing Process

In this embodiment, after irradiation with energy, a photocatalyst treatment layer substrate is remove, by this, a decomposition removal layer formed into a pattern of the presence or absence of a decomposition removal layer, namely, into a pattern composed of regions of the remaining decomposition removal layer and regions of decomposition and removal of a decomposition removal layer, can be obtained.

D. Organic EL Layer Forming Process

Next, the organic EL layer forming process will be illustrated. The organic EL layer forming process in this embodiment is a process of forming an organic EL layer into a pattern by utilizing a difference in wettability of a decomposition removal layer and an electrode layer or electric charge injection transportation layer exposed by decomposition and removal of the decomposition removal layer.

The organic EL layer formed into a pattern in this process will be illustrated below. Usually, as the organic EL layer, a light emitting layer, buffer layer, hole injection layer, hole transportation layer, electron injection layer, electron transportation layer and the like are listed. It is essential that the organic EL layer in this embodiment as described above contains a light emitting layer.

In this embodiment, regarding such an organic EL layer, when for example the above-mentioned electrode layer is an anode and a decomposition removal layer is formed into a pattern on this electrode layer, it may also be permissible that a hole injection layer or hole transportation layer is patterned by utilizing the pattern of such a decomposition removal layer, then, a light emitting layer is patterned by other method, however, in general, a light emitting layer is formed along the pattern of a decomposition removal layer. Further, when an electric charge injection transportation layer is formed on an electrode layer and a decomposition removal layer is formed into a pattern on this electric charge injection transportation layer, a light emitting layer is formed by utilizing the pattern of this decomposition removal layer.

The method of forming an organic EL layer in this embodiment is not particularly restricted providing it is a method capable of forming a pattern by utilizing a difference in wettability of a decomposition removal layer and an electrode layer or electric charge injection transportation layer. Specifically, methods of coating a material forming an organic EL layer as the coating solution on the whole surface such as a spin coating method, casting method, dipping method, bar coat method, blade coat method, roll coat method, gravure coat method, spray coat method and the like, and discharge methods using a dispenser and ink jet, and the like are listed. Of them, discharge methods are preferable, and particularly, an ink jet method is preferable. The reason forth is is that such a method can form a highly precise pattern by utilizing a pattern of a wettability difference of a decomposition removal layer and an electrode layer or electric charge injection transportation layer.

As the organic EL layer forming coating solution used in the case of formation an organic EL layer by such an coating method, coating solution for formation of a light emitting layer used in the case of formation of a light emitting layer which is an essential component of an organic EL layer is mentioned. When a full color EL element is produced, a plurality kinds of coating solutions for formation of a light emitting layer are used. Materials constituting the coating solution for formation of a light emitting layer used in forming a light emitting layer which is an essential component on an organic EL layer will be illustrated below.

(1) Light Emitting Material

The light emitting material used in the present invention is not particularly restricted providing it contains a material emitting fluorescence and it shows light emission, and can have a light emitting function, hole transporting function and electron transporting function at the same time.

As such light emitting materials, dye-based materials, metal complex-based materials and polymer-based materials are listed.

1. Dye-based Material

As the dye-based material, cyclopentamine derivatives, tetraphenylbutadiene derivatives, triphenylamine derivatives, oxadiazole derivatives, pyrazoloquinoline derivatives, distyrylbenzene derivatives, distyrylarylene derivatives, silol derivatives, thiophene ring compounds, pyridine ring compounds, perynone derivatives, perylene derivatives, oligothiophene derivatives, trifumanylamine derivatives, oxaziazole dimer, pyrazoline dimer and the like are listed.

2. Metal Complex-based Material

As the metal complex-based material, metal complexes having Al, Zn, Be and the like or a rare earth metal such as Tb, Eu, Dy and the like as the center metal and oxadiazole, thiadiazole, phenylpyridine, phenylbenzimidazole, quinoline structure and the like as the ligand, such as an alumiquinolinol complex, benzoquinolinolberyllium complex, benzooxazolezinc complex, benzothiazolezinc complex, azomethylzinc complex, porphyrinzinc complex, europium complex and the like are listed.

3. Polymer-based Material

As the polymer-based material, those obtained by polymerizing poly-p-phenylenevinylene derivatives, polythiophene derivatives, poly-p-phenylene derivatives, polysilane derivatives, polyacetylene derivatives, polyfluorene derivatives, polyvinylcarbazole derivatives, the above-mentioned dyes, metal complex-based light emitting materials, and the like are listed.

In the present invention, it is more preferable to use the above-mentioned polymer-based material as the light emitting material from the standpoint of utilization of a merit that a light emitting layer can be formed at good precision with coating solution for formation of a light emitting layer by utilizing a difference in wettability of a decomposition removal layer and an electrode layer.

(2) Solvent

As the solvent for dissolving or dispersing the above-mentioned light emitting material to give coating solution for formation of a light emitting layer is not particularly restricted providing it is a solvent capable of dissolving or dispersing the above-mentioned light emitting material and providing predetermined viscosity and solid concentration.

Specifically, chloroform, methylene chloride, dichloroethane, tetrahydrofuran, toluene, xylene, tetralin, tetramethylbenzene and the like are listed.

(3) Additive

Into the coating solution for formation of a light emitting layer used in the present invention, various additives can be added in addition to the above-mentioned light emitting materials and solvents. For example, a doping material is added in some cases for the purpose of improving light emission efficiency in a light emitting layer and changing light emission wavelength. As this doping material, for example, perylene derivatives, coumarin derivatives, rubrene derivatives, quinacridone derivatives, squalirium derivatives, porphyrin derivatives, styryl-based dyes, tetracene derivatives, pyrazoline derivatives, decacyclene, phenoxazone and the like are listed. In the case of formation of a light emitting layer by an ink jet method, a surfactant and the like are added in some cases for the purpose of improving dischargeability.

E. Others

In this embodiment, an EL element can be produced by further effecting a process of providing a second electrode layer on an organic EL layer in the form of pattern after the above-mentioned organic EL layer forming process.

In such a process, when light is derived, for example, from the upper direction of the EL element shown in FIG. 1E, a second electrode layer can be formed using the above-mentioned transparent electrode material. In contrast, in the EL element shown in FIG. 1E, the second electrode layer is not required to have transparency, and a second electrode layer made of a metal can also be used.

Additionally, a barrier layer of protecting an organic EL layer such as a light emitting layer and the like from the influence by oxygen and water vapor, and a low refractive index layer preventing confinement of light into the element may be provided on the second electrode layer.

(II) Second Embodiment

Next, a second embodiment will be illustrated.

The second embodiment is an embodiment of patterning an organic EL layer using a decomposition removal layer in the same manner as in the first embodiment. However, the decomposition removal layer used in this embodiment is different from that in the first embodiment in that it has an electric charge shielding property.

The term "electric charge shielding property" here referred to means no electric charge injecting and transporting property. Therefore, since electric charges are not transported to an organic EL layer located on a decomposition removal layer having such a nature, the same effect is obtained as in the case of formation of an organic EL layer into a pattern even if the organic EL layer is not formed into a pattern.

The method of producing an EL element in this embodiment comprises at least a decomposition removal layer forming process of preparing an electrode layer, and forming, on the above-mentioned electrode layer or an electric charge injection transportation layer formed on the above-mentioned electrode layer, a decomposition removal layer which is formed of a material having an electric charge shielding property and decomposed and removed by the action of a photocatalyst in irradiation with energy, a decomposition removal layer patterning process of using a photocatalyst treatment layer substrate having a photocatalyst treatment layer containing a photocatalyst formed on a substrate, and placing the above-mentioned photocatalyst treatment layer and the above-mentioned decomposition removal layer at an interval of 200 μm or less, then, conducting pattern irradiation with energy from predetermined direction so that a region to be decomposed and removed of the above-mentioned decomposition removal layer is irradiated with energy, to form the above-mentioned decomposition removal layer into a pattern, a removing process of removing the above-mentioned photocatalyst treatment layer from the above-mentioned decomposition removal layer, and an organic EL layer forming process of forming an organic EL layer so as to cover the surface of the above-mentioned decomposition removal layer and the above-mentioned electrode layer or the above-mentioned electric charge injection transportation layer exposed by decomposition and removal of this decomposition removal layer.

Thus, a decomposition removal layer having an electric charge shielding property is used in this embodiment, therefore, it is advantageous to form an organic EL layer on the whole surface after formation of a decomposition removal layer into a pattern. This is necessarily classified into a region of functioning and a region of no functioning since electric charges are not injected into an organic EL layer positioned on a decomposition removal layer because of the nature of a decomposition removal layer having an electric charge shielding property even if an organic EL layer is not formed into a pattern. Therefore, even if an organic EL layer is not particularly formed into a pattern, the same effect as in the case of formation into a pattern can be obtained, therefore, works required for formation of an organic EL layer can be simplified.

Further, a photocatalyst treatment layer containing a photocatalyst is removed after completion of patterning of a decomposition removal layer, therefore, a photocatalyst is not contained in an EL element itself. Namely, it is a means capable of preventing an influence on an EL element by the semi-eternal action of a photocatalyst and effective for realization of the longer life of the element.

The method of producing an EL element as described above will be illustrated using a drawing.

FIGS. 2A, 2B, 2C, 2D, and 2E show one example of the method of producing an EL element in this embodiment. In this production method, first, a photocatalyst treatment layer substrate 3 comprising a transparent substrate 1 and a photocatalyst treatment layer 2 formed on this transparent substrate 1 is prepared, further, a base material 4 is prepared separately from the photocatalyst treatment layer substrate 3, a first electrode layer 5 is formed on this base material 4, then, a decomposition removal layer 6 is formed on this first electrode layer 5 (see, FIG. 2A).

Figure 2A:
FIGS. 2A, 2B, 2C, 2D, and 2E are process views showing another example of the method of producing an EL element of the present invention.
Figure 2A:
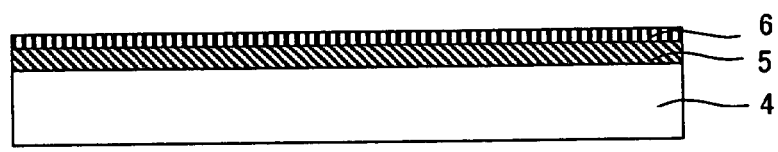
Figure 2B:
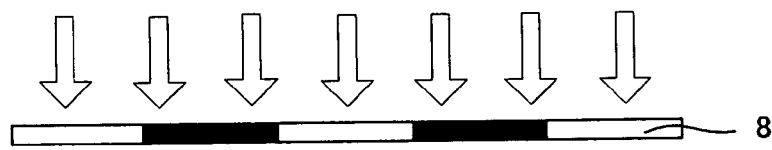
Figure 2B:
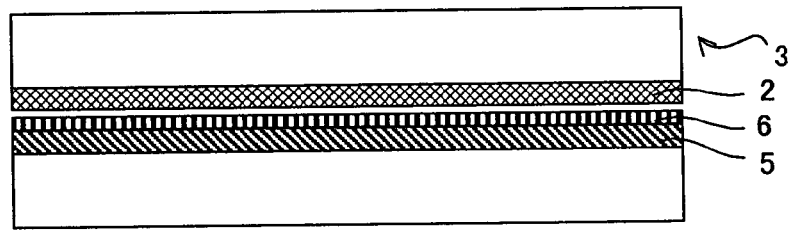
Figure 2C:
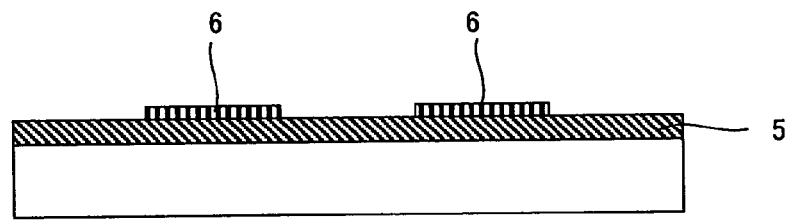

Next, the photocatalyst treatment layer 2 of this photocatalyst treatment layer substrate 3, and the decomposition removal layer 6 are placed so that they face, and irradiated with ultraviolet ray via a photomask 8 (see, FIG. 2B).

By the above-mentioned irradiation with ultraviolet ray, the decomposition removal layer 6 in the ultraviolet irradiation region is decomposed and removed by the action of a photocatalyst contained in the photocatalyst treatment layer 2. Then, by removing (separating) the photocatalyst treatment layer substrate 3 from the decomposition removal layer 6, the decomposition removal layer 6 in the ultraviolet irradiation region is decomposed and removed, to obtain the decomposition removal layer 6 formed into a pattern (see, FIG. 2C).

Figure 2D:
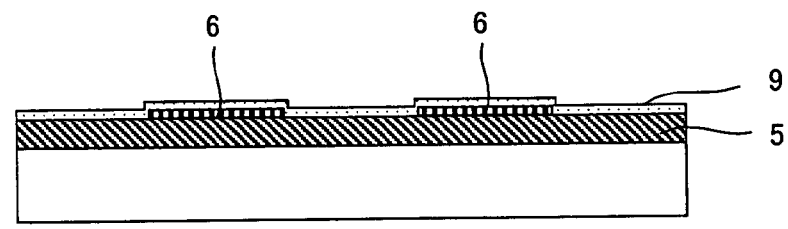

Further, an organic EL layer 9 is formed on the first electrode layer 5 on which the decomposition removal layer 6 in the form of pattern is formed (see, FIG. 2D).

Figure 2E:
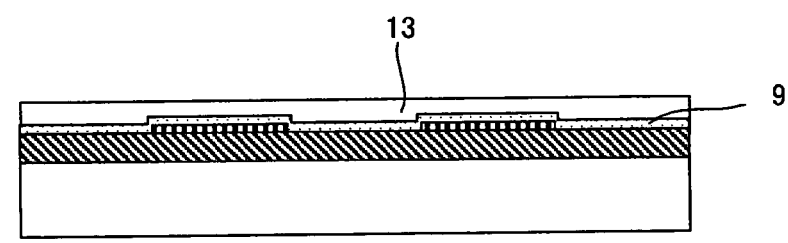

Next, a second electrode layer 13 is formed on an organic EL layer 9 (see, FIG. 2E). By this, when the second electrode layer 13 is, for example, a transparent electrode layer, an EL element from which light is taken from the upper part in the figure can be obtained.

Thus, the decomposition removal layer in this embodiment has an electric charge shielding property, the same effect can be obtained as in the case of formation into a pattern even if an organic EL layer is formed on the whole surface.

In the method of producing an EL element of this embodiment as described above, the processes are the same as the processes in the first embodiment, therefore, descriptions thereof are omitted, and the decomposition removal layer in this embodiment which is a point differing from the first embodiment will be mainly illustrated.

(1) Decomposition Removal Layer

The decomposition removal layer in this embodiment is that which is decomposed and removed and formed into a pattern by irradiation with energy via a photocatalyst treatment layer in the same manner as in the first embodiment. Further, by utilizing an electric charge shielding property held by the decomposition removal layer in this embodiment, the same effect can b obtained as in the case of formation into a pattern even if an organic EL layer is not formed along the pattern of the decomposition removal layer. Therefore, the material used in such a decomposition removal layer is a material having the above-mentioned property of a decomposition removal layer, namely, decomposed and removed by the action of a photocatalyst contained in a photocatalyst treatment layer placed at predetermined gap from a decomposition removal layer, and preferably a material having an electric charge shielding property. Specifically, aliphatic or aromatic organic substances having a C—C bond are listed. Of them, those which are removed as $CO_2$ by the action of a photocatalyst are preferable.

The thickness of such a decomposition removal layer is not particularly restricted providing a decomposition removal layer can be decomposed and removed by the action of a photocatalyst in irradiation with energy, and an effect of shielding against injection and transportation of electric charges is not deteriorated. Specifically, the thickness is preferably from 0.001 μm to 1 μm, particularly preferably from 0.01 to 0.1 μm.

(2) Organic EL Layer

The organic EL layer in this embodiment will be illustrated. In this embodiment, an organic EL layer can be formed on the whole surface since a decomposition removal layer has an electric charge shielding property as described above. Namely, the reason for this is that electric charges are not injected into an organic EL layer located on a decomposition removal layer due to the action by the electric charge shielding property of a decomposition removal layer, therefore, the same effect as in the case of formation into a pattern is obtained even if an organic EL layer is formed on the whole surface.

The method of forming such an organic EL layer is not particularly restricted providing it is a method capable of forming an organic EL layer in the form of membrane since formation into a pattern is not particularly required. For example, a method of formation on the whole surface by a vapor deposition method and printing method, a method of coating a material forming an organic EL layer as coating solution, coating methods such as, for example, a spin coating method, casting method, dipping method, bar coat method, blade coat method, roll coat method, gravure coat method, flexo printing method, spray coat method and the like are listed.

Other matters regarding an organic EL layer are the same as those described in "D. Organic EL layer formation process in the first embodiment" described above, therefore, descriptions thereof are omitted here.

(III) Third Embodiment

Next, a third embodiment will be illustrated.

This embodiment is an embodiment of patterning an organic EL layer by utilizing a pattern of a wettability difference using a layer in which a wettability changes, differing from the first and second embodiments described above. Specifically, an electrode layer is used as the layer in which a wettability changes.

The method of producing an EL element in this embodiment as described above comprises an electrode layer patterning process of using a photocatalyst treatment layer substrate having a photocatalyst treatment layer containing a photocatalyst formed on a substrate, and placing the above-mentioned photocatalyst treatment layer and electrode layer at an interval of 200 µm or less, then, conducting pattern irradiation with energy from predetermined direction, to form a pattern of a wettability difference on the surface of the above-mentioned electrode layer, a removing process of removing the above-mentioned photocatalyst treatment layer from the above-mentioned electrode layer, and an organic EL layer forming process of forming an organic EL layer on a region having improved wettability with liquid of the above-mentioned electrode layer.

In the method of producing an EL element in this embodiment as described above, a pattern of a wettability difference is formed on the surface of an electrode layer by irradiating the electrode layer with energy via a photocatalyst treatment layer in the same manner as in the first and second embodiments. Further, an organic EL layer is formed into a pattern on the electrode layer by utilizing such an electrode layer having a pattern formed depending on a difference in wettability. Therefore, after formation of a pattern of a wettability difference on an electrode layer by irradiation with energy, an organic EL layer is formed into a pattern without performing post treatments such as development and cleaning, consequently, production efficiency can be improved.

The method of producing an EL element in this embodiment as described above will be illustrated using a drawing.

FIGS. 3A, 3B, 3C, 3D and 3E show one example of the method of producing an EL element in this embodiment. In this production method, first, a photocatalyst treatment layer substrate 3 comprising a transparent substrate 1 and a photocatalyst treatment layer 2 formed on this transparent substrate 1 is prepared, further, a base material 4 having a first electrode layer 5 showing changing in wettability by the action of a photocatalyst in irradiation with energy is prepared separately from the photocatalyst treatment layer substrate 3 (see, FIG. 3A).

Figure 3A:
FIGS. 3A, 3B, 3C, 3D and 3E are process views showing another example of the method of producing an EL element of the present invention.
Figure 3B:
Figure 3C:
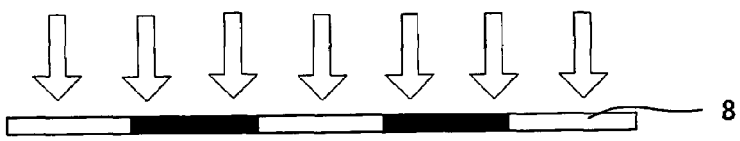
Figure 3D:
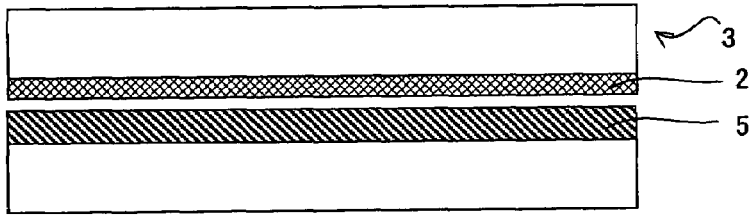

Next, the photocatalyst treatment layer 2 of this photocatalyst treatment layer substrate 3, and the first electrode layer 5 are placed so that they face, and irradiated with ultraviolet ray via a photomask 8 (see, FIG. 3B).

By the above-mentioned irradiation with ultraviolet ray, wettability on the surface of the first electrode layer 5 at the ultraviolet ray irradiation region changes to direction of lowering in contact angle with liquid, by the action of a photocatalyst contained in the photocatalyst treatment layer 2. This region at which wettability changes to direction of lowering in contact angle with liquid is called a lyophilic region. Next, by removing (separating) the photocatalyst treatment layer substrate 3 from the first electrode layer 5, the first electrode layer 5 having a lyophilic region 5' formed on its surface is obtained (see, FIG. 3C).

Organic EL layer forming coating solution is coated on the first electrode layer 5 to form an organic EL layer 9 on the lyophilic region 5' showing wettability changed to direction of lowering in contact angle with liquid by the above-mentioned irradiation with ultraviolet ray.

Figure 3E:
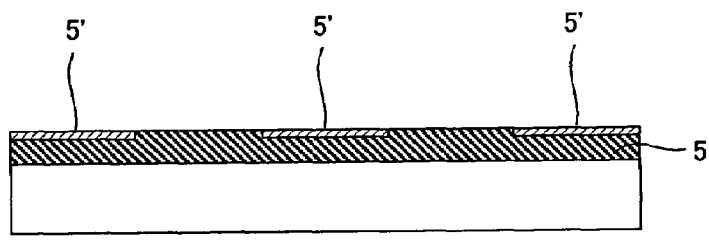

Further, a second electrode layer 13 is formed on an organic EL layer 9 (see, FIG. 3E). By this, when the second electrode layer 13 is, for example, a transparent electrode layer, an EL element from which light is taken from the upper part in the figure can be obtained.

The method of producing an EL element of the present invention as described above will be illustrated at each process.

A. Electrode Layer Patterning Process

The electrode layer patterning process in this embodiment is a process of using a photocatalyst treatment layer substrate having a photocatalyst treatment layer containing a photocatalyst formed on a substrate, and placing the above-mentioned photocatalyst treatment layer and electrode layer at an interval of 200 µm or less, then, conducting pattern irradiation with energy from predetermined direction, to form a pattern of a wettability difference on the surface of the above-mentioned electrode layer.

The photocatalyst treatment layer substrate used in this process is the same as described in the first embodiment described above, therefore, descriptions thereof are omitted here.

Here, the material forming an electrode layer in this embodiment is not particularly restricted providing it is a material having conductivity and showing changing in wettability by the action of a photocatalyst in irradiation with energy. Specifically, ITO, IZO, $SnO_2$, ZnO, Al, Cr and the like. These materials often show lowered wettability due to the influence of an organic substance adhered on the surface of an oxide formed on the surface, and the like are listed, however, by irradiating with energy via a photocatalyst treatment layer, the surface can be modified and the like to improve wettability.

In such an electrode layer, when irradiated with energy via a photocatalyst treatment layer, wettability can be changed to direction of lowering of contact angle with liquid by the action of a photocatalyst. Therefore, a lyophilic region having wettability change to direction of lowering in contact angle with liquid, and a liquid-repellent region showing no change in wettability are formed into a pattern, in this process.

B. Removing Process

Next, the removing process in this embodiment will be illustrated. This process is a process in which, after conducting irradiation with energy, a photocatalyst treatment layer substrate is removed from an electrode layer.

This process as described above is the same as "C. Removing process" in the above-mentioned first embodiment, therefore, descriptions thereof are omitted here.

C. Organic EL Layer Forming Process

The organic EL layer forming process in this embodiment is a process of coating organic EL layer forming coating solution on an electrode layer having a pattern of a difference in wettability of a lyophilic region and liquid-repellent region by the above-mentioned process, and forming an organic EL layer into a pattern on the lyophilic region.

Matters regarding this process are also the same as described in "D. Organic EL layer forming process in the above-mentioned first embodiment", therefore, descriptions thereof are omitted here.

In the method of producing an EL element in this embodiment, when each layer constituting an EL element is poor in self supporting property, it is possible to maintain strength by forming an EL element on a base material. Matters regarding such a base material are also the same as described in the above-mentioned first embodiment, therefore, descriptions thereof are omitted here.

(IV) Fourth Embodiment

Next, the fourth embodiment will be illustrated. This embodiment is an embodiment of conducting patterning of an organic EL layer using a layer in which a wettability changes in the same manner as in the third embodiment. However, in the third embodiment, the layer in which a wettability changes is an electrode layer, however, this embodiment is different in that it is an electric charge injection transportation layer.

The method of producing an EL element in such a fourth embodiment comprises at least an electric charge injection transportation layer forming process of forming an electric charge injection transportation layer in which a wettability changes so that contact angle with liquid lowers by the action of a photocatalyst in irradiation with energy, on an electrode layer, an electric charge injection transportation layer patterning process of using a photocatalyst treatment layer substrate having a photocatalyst treatment layer containing a photocatalyst formed on a substrate, and placing the above-mentioned photocatalyst treatment layer and the above-mentioned electric charge injection transportation layer at an interval of 200 μm or less, then, conducting pattern irradiation with energy from predetermined direction, to form a pattern of a wettability difference on the above-mentioned electric charge injection transportation layer, a removing process of removing the above-mentioned photocatalyst treatment layer from the above-mentioned electric charge injection transportation layer, and an organic EL layer forming process of forming an organic EL layer on a region having improved wettability with liquid of the above-mentioned electric charge injection transportation layer.

In the method of producing an EL element in this embodiment as described above, by using an electric charge injection transportation layer in which a wettability changes by the action of a photocatalyst in irradiation with energy and irradiating the electric charge injection transportation layer having such a property with energy via a photocatalyst treatment layer containing a photocatalyst, a pattern is formed on the electric charge injection transportation layer depending on a difference in wettability. Further, since patterning of an organic EL layer is conducted by utilizing a pattern of a wettability difference formed on such an electric charge injection transportation layer, post treatments such as development, cleaning and the like after irradiation with energy are not necessary in patterning of an organic EL layer, therefore, there is a merit that an EL element can be produced at low cost in fewer processes than conventional.

The method of producing an EL element in this embodiment having such a merit will be illustrated using a drawing.

FIGS. 4A, 4B, 4C, 4D and 4E show one example of the method of producing an EL element in this embodiment. In this production method, first, a photocatalyst treatment layer substrate 3 comprising a transparent substrate 1 and a photocatalyst treatment layer 2 formed on this transparent substrate 1 is prepared, further, a base material 4 is prepared separately from the photocatalyst treatment layer substrate 3, a first electrode layer 5 is formed on this base material 4, further, an electric charge injection transportation layer 7 showing changing in wettability by irradiation with energy is formed on the first electrode layer 5 (see, FIG. 4A).

Figure 4A:
FIGS. 4A, 4B, 4C, 4D and 4E are process views showing another example of the method of producing an EL element of the present invention.
Figure 4A:
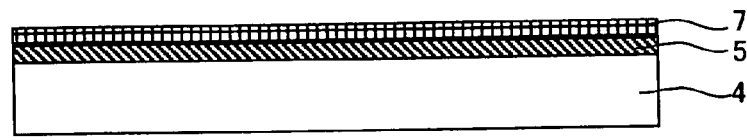
Figure 4B:
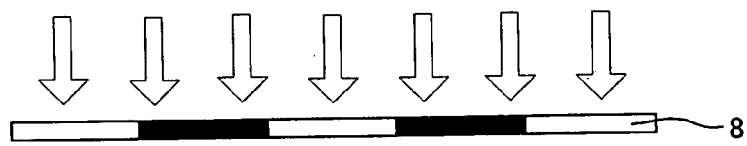
Figure 4B:
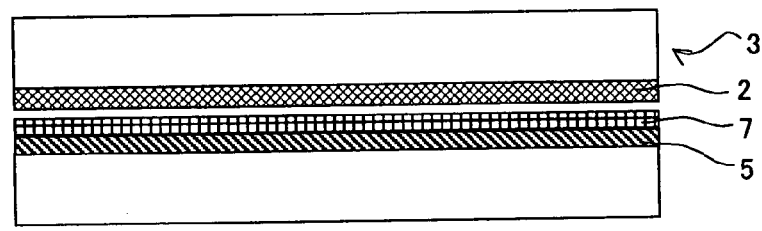
Figure 4C:
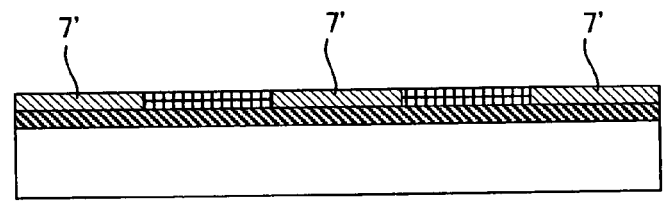
Figure 4D:
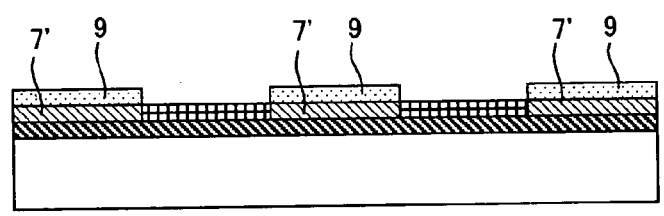

Next, the photocatalyst treatment layer 2 of this photocatalyst treatment layer substrate 3, and the electric charge injection transportation layer 7 are placed so that they face, and irradiated with ultraviolet ray via a photomask 8 (see, FIG. 4B).

By the above-mentioned irradiation with ultraviolet ray, the wettability of the electric charge injection transportation layer 7 at the ultraviolet ray irradiation region changes to direction of lowering in contact angle with liquid by the action of a photocatalyst contained in the photocatalyst treatment layer 2. This region at which wettability changes to direction of lowering in contact angle with liquid is called a lyophilic region. Next, by removing (separating) the photocatalyst treatment layer substrate 3 from the electric charge injection transportation layer 7, the electric charge injection transportation layer 7 having a lyophilic region 7' formed thereon is obtained (see, FIG. 4C).

Organic EL layer forming coating solution is coated on the electric charge injection transportation layer 7 to form an organic EL layer 9 on the lyophilic region 7' showing wettability changed to direction of lowering in contact angle with liquid by the above-mentioned irradiation with ultraviolet ray.

Figure 4E:
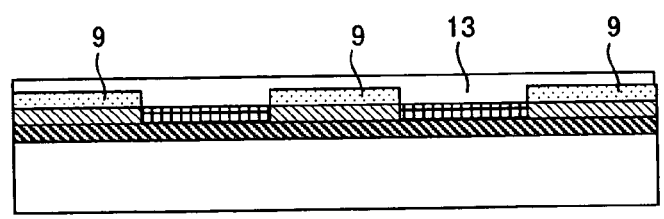

Further, a second electrode layer 13 is formed on an organic EL layer 9 (see, FIG. 4E). By this, when the second electrode layer 13 is, for example, a transparent electrode layer, an EL element from which light is taken from the upper part in the figure can be obtained.

The method of producing an EL element of the present invention as described above will be illustrated at each process.

A. Electric Charge Injection Transportation Layer Forming Process

The electric charge injection transportation layer forming process will be first illustrated. The electric charge injection transportation layer forming process in this embodiment is a process of forming an electric charge injection transportation layer in which a wettability changes so that contact angle with liquid lowers by the action of a photocatalyst in irradiation with energy, on an electrode layer.

The electric charge injection transportation layer formed in this embodiment will be illustrated below.

(Electric Charge Injection Transportation Layer)

The electric charge injection transportation layer in this embodiment will illustrated. The electric charge injection transportation layer in this embodiment is formed in some cases from a material having at least a binder and a photocatalyst, and formed, in some cases, from the material generally used as the electric charge injection transportation layer as described in the item of "A. Decomposition removal layer forming process in the first embodiment" as described above. Such an electric charge injection transportation layer includes a hole injection transportation layer injecting holes stably into a light emitting layer and transporting holes and an electron injection transportation layer injecting electrons stably into a light emitting layer and transporting electrons. In this embodiment, the above-mentioned electrode layer is in general often an anode, therefore, in this process, a hole injection transportation layer is formed.

Such an electric charge injection transportation layer will be illustrated in detail below.

(1) When Electric Charge Injection Transportation Layer has Binder and Photocatalyst A case in which the electric charge injection transportation layer is composed at least of a binder and a photocatalyst in this embodiment will be illustrated, first.

It is preferable that the content of a photocatalyst in such a case is in a range of 1% to 90%, particularly from 10% to 65%. The reason for this is that, within the above-mentioned range, even if a photocatalyst is contained in an EL element itself, an influence by the semi-eternal action of a photocatalyst can be decreased to a negligible extent. Further, since a photocatalyst has an excellent electric charge injecting and transporting property, light emission efficiency can be improved by using an electric charge injection transportation layer containing a photocatalyst.

Further, in the case of conducting irradiation of an electric charge injection transportation layer having a content within the above-mentioned range directly with energy and forming a pattern of a wettability difference on the electric charge injection transportation layer, sensitivity is poor and excellent change in wettability cannot be obtained since the content of a photocatalyst is small. However, in this embodiment, by separately using a photocatalyst treatment layer containing a photocatalyst in sufficient amount to manifest its action and conducting energy irradiation via such a photocatalyst treatment layer, the insufficient action of a photocatalyst contained in an electric charge injection transportation layer can be supplemented and a sufficient change in wettability can be caused in the electric charge injection transportation layer. Depending on a photocatalyst, smoothness is lowered, therefore, it is possible to improve smoothness by lowering its content.

The photocatalyst used in this case is the same as described in the item of "B. Decomposition removal layer patterning process in the first embodiment" described above, therefore, descriptions thereof are omitted here.

The binder constituting an electric charge injection transportation layer in this case is not particularly restricted providing it shows a change in wettability of the surface by the action of the above-mentioned photocatalyst, and in general, it is preferably a binder showing a change in wettability so as to lower contact angle with liquid at the surface of the electric charge injection transportation layer by the action of a photocatalyst in irradiation with energy.

By using an electric charge injection transportation layer showing a change in wettability so as to lower contact angle with liquid by irradiation with energy as described above, wettability can be easily changed in the form of pattern by conducting irradiation with energy via the above-mentioned photocatalyst treatment layer, and a pattern of a lyophilic region having small contact angle with liquid can be formed, and by adhering organic EL layer forming coating solution to this lyophilic region, an EL element can be formed easily. Therefore, an EL element can be produced efficiently, being advantageous in const.

Here, the lyophilic region is a region changed to direction of lowering in contact angle with liquid by irradiation with energy, on the other hand, the liquid-repellent region is a region not irradiated with energy and a region showing larger contact angle with liquid than the lyophilic region.

It is preferable that the above-mentioned electric charge injection transportation layer that is not irradiated with energy, namely the liquid-repellent region, shows a contact angle with liquid having the equivalent surface tension to the surface tension of organic EL layer forming coating solution to be coated, of 30° or more, preferably 40° or more, particularly preferably 50° or more. The reason for this is that, since a part not irradiated with energy is a part required to have liquid-repellency in this embodiment, therefore, when contact angle with liquid is small, liquid repellency is not sufficient, and there occurs undesirably a possibility of remaining of the above-mentioned organic EL layer forming coating solution.

It is preferable that the above-mentioned electric charge injection transportation layer is a layer showing lowering in contact angle with liquid when irradiated with energy and resultantly having a contact angle with liquid having the equivalent surface tension to the surface tension of organic EL layer forming coating solution to be coated, of 30° or less, preferably 20° or less, particularly preferably 10° or less. When contact angle with liquid in a region irradiated with the energy, namely a lyophilic region, is high, there is a possibility of deterioration in spreading of organic EL layer forming coating solution at this part, and there is a possibility of occurrence of problems such as lacking in an organic EL layer and the like.

The method of measuring contact angle with liquid here referred to is the same as described in "Decomposition removal layer in the first embodiment" described above.

When the electric charge injection transportation layer as described above is used in this embodiment, fluorine is contained in this electric charge injection transportation layer, further, the above-mentioned electric charge injection transportation layer may be formed so that the fluorine content on the surface of this electric charge injection transportation layer lowers as compared with before irradiation with energy by the action of the above-mentioned photocatalyst, in irradiating the electric charge injection transportation layer with energy.

With the electric charge injection transportation layer having such a feature, a pattern can be formed easily from a part having small fluorine content by conducting pattern irradiation with energy. Here, fluorine has extremely low surface energy, and because of this reason, the surface of a substance containing fluorine in large amount shows smaller critical surface tension. Therefore, the critical surface tension of a part having smaller fluorine content is stronger as compared with the critical surface tension of the surface of a part having larger fluorine content. That is, this means that a part having smaller fluorine content is a lyophilic region in comparison with a part having larger fluorine content. Therefore, formation of a pattern composed of a part having smaller fluorine content as compared with the surrounding surface leads to formation of a pattern of a lyophilic region in a liquid-repellent region.

Accordingly, when such an electric charge injection transportation layer is used, a pattern of a lyophilic region can be easily formed in the liquid-repellent region by conducting pattern irradiation with energy, therefore, it is easily possible to form an organic EL layer only in this lyophilic region, and an EL element having excellent quality can be produced at low cost.

As described above, regarding the content of fluorine contained in an electric charge injection transportation layer containing fluorine, it is preferable that the fluorine content in a lyophilic region having low fluorine content formed by irradiation with energy is 10 or less, preferably 5 or less, particularly preferably 1 or less when the fluorine content at a part not irradiated with energy is 100.

Within such a range, a large difference can be produced in wettability of a part irradiated with energy and a part not irradiated with energy. Therefore, the reason for this is that, by forming an organic EL layer on such an electric charge injection transportation layer, it is possible to form an organic EL layer correctly only on a lyophilic region having lowered fluorine content, and an EL element can be obtained with good precision. This lowering ratio is based in weight.

For measurement of fluorine content in such an electric charge injection transportation layer, various methods generally used can be used, and there is no limitation provided that it is a method capable of quantitatively measuring the amount of fluorine on the surface such as, for example, a X ray Photoelectron Spectroscopy (also referred to as ESCA (Electron Spectroscopy for Chemical Analysis)), fluorescent X ray analysis method, mass spectrometry and the like.

The material used in such an electric charge injection transportation layer is not particularly restricted provided it has the above-mentioned property of an electric charge injection transportation layer, namely, it is a material showing a change in wettability by a photocatalyst in a photocatalyst treatment layer to be contacted by irradiation with energy and having a main chain not easily deteriorated and decomposed by the action of a photocatalyst, and for example, (1) organopolysiloxanes manifesting large strength by hydrolysis and polycondensation of chloro or alkoxysilane and the like by a sol gel reaction and the like, (2) organopolysiloxanes such as an organopolysiloxane obtained by cross-linking of a reactive silicone excellent in water repellency and oil repellency, are listed.

In the case of the above-mentioned (1), preferable are organopolysiloxanes which are hydrolysis condensates or co-hydrolysis condensates of one or more of silicon compounds of the general formula:

$$Y_n SiX_{(4-n)}$$

(wherein, Y represents an alkyl group, fluoroalkyl group, vinyl group, amino group, phenyl group or epoxy group, and X represents an alkoxyl group, acetyl group or halogen. n is an integer of 0 to 3.). The carbon number of the group represented by Y is preferably in a range of 1 to 20, and it is preferable that the alkoxy group represented by X is a methoxy group, ethoxy group, propoxy group or butoxy group.

Particularly organopolysiloxanes having a fluoroalkyl group can be preferably used, and specifically hydrolysis condensates or co-hydrolysis condensates of one or more of the following fluoroalkylsilanes are listed, and in general, those known as a fluorine-based silane coupling agent can be used.

$CF_3(CF_2)_3CH_2CH_2Si(OCH_3)_3$;
$CF_3(CF_2)_5CH_2CH_2Si(OCH_3)_3$;
$CF_3(CF_2)_7CH_2CH_2Si(OCH_3)_3$;
$CF_3(CF_2)_9CH_2CH_2Si(OCH_3)_3$;
$(CF_3)_2CF(CF_2)_4CH_2CH_2Si(OCH_3)_3$;
$(CF_3)_2CF(CF_2)_6CH_2CH_2Si(OCH_3)_3$;
$(CF_3)_2CF(CF_2)_8CH_2CH_2Si(OCH_3)_3$;
$CF_3(C_6H_4) C_2H_4Si(OCH_3)_3$;
$CF_3(CF_2)_3(C_6H_4) C_2H_4Si(OCH_3)_3$;
$CF_3(CF_2)_5(C_6H_4)C_2H_4Si(OCH_3)_3$;
$CF_3(CF_2)_7(C_6H_4) C_2H_4Si(OCH_3)_3$;
$CF_3(CF_2)_3CH_2CH_2SiCH_3(OCH_3)_2$;
$CF_3(CF_2)_5CH_2CH_2SiCH_3(OCH_3)_2$;
$CF_3(CF_2)_7CH_2CH_2SiCH_3(OCH_3)_2$;
$CF_3(CF_2)_9CH_2CH_2SiCH_3(OCH_3)_2$;
$(CF_3)_2CF(CF_2)_4CH_2CH_2SiCH_3(OCH_3)_2$;
$(CF_3)_2CF(CF_2)_6CH_2CH_2Si CH_3(OCH_3)_2$;
$(CF_3)_2CF(CF_2)_8CH_2CH_2Si CH_3(OCH_3)_2$;
$CF_3(C_6H_4) C_2H_4SiCH_3(OCH_3)_2$;
$CF_3(CF_2)_3(C_6H_4) C_2H_4SiCH_3(OCH_3)_2$;
$CF_3(CF_2)_5(C_6H_4) C_2H_4SiCH_3(OCH_3)_2$;
$CF_3(CF_2)_7(C_6H_4) C_2H_4SiCH_3(OCH_3)_2$;
$CF_3(CF_2)_3CH_2CH_2Si(OCH_2CH_3)_3$;
$CF_3(CF_2)_5CH_2CH_2Si(OCH_2CH_3)_3$;
$CF_3(CF_2)_7CH_2CH_2Si(OCH_2CH_3)_3$;
$CF_3(CF_2)_9CH_2CH_2Si(OCH_2CH_3)_3$; and
$CF_3(CF_2)_7SO_2N(C_2H_5) C_2H_4CH_2Si(OCH_3)_3$ By using the polysiloxane containing a fluoroalkyl group as described above as a binder, the liquid-repellency of a part not irradiated with energy of an electric charge injection transportation layer increases significantly, and such a polysiloxane manifests a function to prevent adhering of an organic EL layer composition such as an ink for coloring a pixel part when the EL element is, for example, a color filter.

As the reactive silicone in the above-mentioned (2), compounds having a skeleton of the following chemical formula 1 are listed.

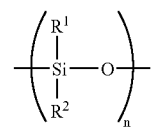

Chemical formula 1

In the formula, n is an integer of 2 or more, each of $R^1$ and $R^2$ represents a substituted or unsubstituted alkyl, alkenyl, aryl or cyanoalkyl group having 1 to 10 carbon atoms, and 40% or less by molar ratio of the total amount are composed of vinyl, phenyl and halogenated phenyl. Those in which $R^1$ and $R^2$ represent a methyl group are preferable since then the surface energy is least, and it is preferable that 60% or more by molar ratio are composed of a methyl group. At the chain end or side chain, at least one or more reactive groups such as a hydroxyl group and the like are present in the molecule.

Together with the above-mentioned organopolysiloxane, a stable organosilicone compound causing no cross-linking reaction such as dimethylpolysiloxane may be mixed.

In this embodiment, various materials such as organopolysiloxanes and the like can be used in an electric charge injection transportation layer, and as described above, inclusion of fluorine in an electric charge injection transportation layer is effective for formation of a pattern of wettability. Therefore, it is preferable that fluorine is contained in a material not easily deteriorated or decomposed by the action of a photocatalyst, specifically, fluorine is contained in an organopolysiloxane material, to give an electric charge injection transportation layer.

In addition to the above-mentioned surfactants, the electric charge injection transportation layer can contain oligomers, polymers and the like of polyvinyl alcohol, unsaturated polyesters, acrylic resins, polyethylene, diallyl phthalate, ethylene propylene diene monomer, epoxy resins, phenol resins, polyurethane, melanine resins, polycarbonates, polyvinyl chloride, polyamides, polyimides, styrene butadiene rubber, chloroprene rubber, polypropylene, polybutylene, polystyrene, polyvinyl acetate, polyesters, polybutadiene, polybenzimidazole, polyacrylonitrile, epichlorohydrin, polysulfide, polyisoprene and the like.

Such an electric charge injection transportation layer can be formed by dispersing the above-mentioned components, if necessary together with other additives, to prepare coating solution, and coating this coating solution on a substrate. The solvent used is preferably an alcohol-type organic solvent such as ethanol, isopropanol and the like. Coating can be conducted by a known coating method such as spin coat, spray coat, dip coat, roll coat, bead coat and the like. When a component of ultraviolet-hardening type is contained, a photocatalyst treatment layer can be formed by conducting a hardening treatment irradiating with ultraviolet ray.

In this embodiment, the thickness of this electric charge injection transportation layer is preferably from 0.001 μm to 1 μm, particularly preferably from 0.01 μm to 0.1 μm from the standpoint of correlation with changing speed of wettability due to a photocatalyst, and the like.

When an electric charge injection transportation layer made of the above-mentioned component is used in this embodiment, the wettability of a part irradiated with energy can be changed to give lyophilicity to cause a large difference in wettability from a part not-irradiated with energy, using the action of oxidation, decomposition and the like of an additive or an organic group which is a part of the above-mentioned components, by the action of a photocatalyst in a photocatalyst treatment layer. Accordingly, by enhancing receptivity (lyophilicity) and repellency (liquid-repellency) with organic EL layer forming coating solution, an EL element having excellent quality and advantageous also in cost can be obtained.

(2) Case of Formation from Material Generally Used as Electric Charge Injection Transportation Layer In this case, the material is not particularly restricted providing it is a material of an electric charge injection transportation layer described in the item of "Decomposition removal layer forming process in the first embodiment" described above, and preferable are materials showing a change in wettability by irradiation with energy via a photocatalyst treatment layer. Specifically, those containing a binder among the above-mentioned photocatalyst treatment layers, polyethylenedioxythiophene/polystyrenesulfonate (PEDOT/PSS), polyaniline and the like are listed.

B. Electric Charge Injection Transportation Layer Patterning Process

Next, the electric charge injection transportation layer patterning process will be illustrated. This process is a process of using a photocatalyst treatment layer substrate having a photocatalyst treatment layer containing a photocatalyst formed on a substrate, and placing the above-mentioned photocatalyst treatment layer and the above-mentioned electric charge injection transportation layer at an interval of 200 μm or less, then, conducting pattern irradiation with energy from predetermined direction, to form a pattern of a wettability difference on the above-mentioned electric charge injection transportation layer.

The photocatalyst treatment layer substrate used in this process is the same as described in the above-mentioned first embodiment, therefore, descriptions thereof are omitted here.

In this process, a pattern of a wettability difference, specifically, a lyophilic region which is a region irradiated with energy and changed to direction of lowering in contact angle with liquid and a liquid-repellent region which is a region not irradiated with energy and having larger wettability than contact angle with liquid of the lyophilic region are formed on the above-mentioned electric charge injection transportation layer.

C. Removing Process

Next, the removing process in this embodiment will be illustrated. This process is a process of obtaining an electric charge injection transportation layer carrying a pattern formed thereon composed of a lyophilic region which is a region showing wettability changed to direction of lowering in contact angle with liquid and a liquid-repellent region which is a region not irradiated with energy and is a region having larger contact angle with liquid than the lyophilic region, by removal of a photocatalyst treatment layer substrate after conducting irradiation with energy.

This process as described above is the same as described in "C. Removing process" in the first embodiment described above, descriptions thereof are omitted here.

D. Organic EL Layer Forming Process

The organic EL layer forming process in this embodiment is a process of coating organic EL layer forming coating solution on an electric charge injection transportation layer carrying thereon a pattern of difference in wettability of a lyophilic region and liquid-repellent region by the above-mentioned process, to form an organic EL layer into a pattern on the lyophilic region.

The organic EL layer formed in this process is preferably a light emitting layer since it is formed on an electric charge injection transportation layer.

Matters regarding this process are also the same as described in "D. Organic EL layer forming process" in the first embodiment described above, therefore, descriptions thereof are omitted here.

In the method of producing an EL element in this embodiment, when an EL element is poor in a self supporting property, it is possible to maintain strength by forming an EL element on a base material. Matters regarding such a base material are also the same as described in the first embodiment described above, therefore, descriptions thereof are omitted here.

II. EL Element

Next, the EL element of the present invention will be illustrated.

The EL element of the present invention is an EL element produced by utilizing a decomposition removal layer for patterning of an organic EL layer. Further, such an EL element can be classified into a case of production by utilizing the wettability a decomposition removal layer and a case of production by utilizing a electric charge shielding property. Such an EL element will be described below.

First, the EL element in the case of formation of an organic EL layer by utilizing the wettability of a decomposition removal layer will be illustrated. The EL element in this case comprises at least a first electrode layer, a decomposition removal layer which is in the form of pattern on the above-mentioned first electrode layer or an electric charge injection transportation layer formed on the above-mentioned first electrode layer, decomposed and removed by the action of a photocatalyst in irradiation with energy, and shows different contact angle with liquid from that of the above-mentioned first electrode layer or the above-mentioned electric charge injection transportation layer, an organic EL layer which is formed on the electrode layer or electric charge injection transportation layer exposed by decomposition and removal of the above-mentioned decomposition removal layer and contains at least a light emitting layer, and a second electrode layer formed on the above-mentioned organic electroluminescent layer.

In the present invention, a decomposition removal layer is formed into a pattern on an electrode layer or electric charge injection transportation layer, and this decomposition removal layer shows different contact angle with liquid from that of the electrode layer or electric charge injection transportation layer located under the decomposition removal layer, therefore, an EL element having an organic EL layer formed into a highly precise pattern along the pattern of the decomposition removal layer formed into a pattern can be obtained by utilizing this difference in wettability. Further, a photocatalyst is not contained in an EL element itself, therefore, it has a merit capable of preventing an influence on an EL element by the semi-eternal action of a photocatalyst.

Such an EL element of the present invention will be illustrated using a drawing.

Figure 9:
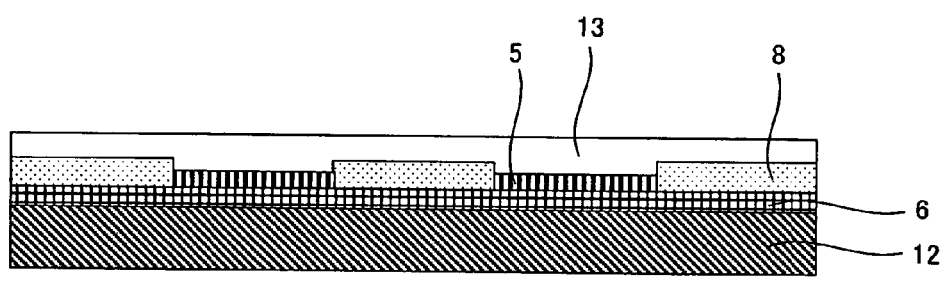
FIG. 9 is a schematic sectional view showing one example of the EL element of the present invention.

FIG. 9 illustrates one example of the EL element of the present invention. First, an electric charge injection transportation layer 6 is formed on a first electrode layer 12. On this electric charge injection transportation layer 6, a decomposition removal layer 5 is formed into a pattern. This decomposition removal layer 5 has a property that it is decomposed and removed by the action of a photocatalyst in irradiation with energy, further, maintains different wettability from that of the electric charge injection transportation layer 6 located under this decomposition removal layer 5. Therefore, since wettability is different between a region on which the decomposition removal layer 5 is formed and a region on which the decomposition removal layer 5 is not formed, a pattern of a wettability difference is formed by forming the decomposition removal layer into a pattern. By utilizing this difference in wettability, an organic EL layer 8 is formed. A second electrode layer 13 which is a transparent electrode layer is formed on the organic EL layer 8. In this case, since the second electrode layer 13 is a transparent electrode layer, an EL element from the upper surface of which light is derived in FIG. 9 is obtained. A case in which the first electrode layer 12 is a transparent electrode, or a case in which both of the first and second electrode layers are a transparent electrode, may also be permissible.

Though in FIG. 9, the decomposition removal layer 5 is formed on the electric charge injection transportation layer 6, it is also possible to form it on the first electrode layer 12. Further, by forming an EL element on a base material, strength can be maintained even in the case of an EL element lacking in a self supporting property.

Such an EL element of the present invention can be produced, for example, by the production method shown in the first embodiment.

Members constituting such an EL element are the same as described in the first embodiment, therefore, descriptions thereof are omitted here.

Next, a case in which a decomposition removal layer has an electric charge shielding property will be illustrated. The EL element in such a case comprises at least a first electrode layer, a decomposition removal layer which is in the form of pattern on the above-mentioned first electrode layer or an electric charge injection transportation layer formed on the above-mentioned first electrode layer, decomposed and removed by the action of a photocatalyst in irradiation with energy, and has an electric charge shielding property, an organic EL layer which is formed to cover the above-mentioned first electrode layer and decomposition removal layer and contains at least a light emitting layer, and a second electrode layer formed on the above-mentioned organic EL layer.

When a decomposition removal layer having an electric charge shielding property is thus used, electric charges are not injected into an organic EL layer located on the decomposition removal layer even if an organic EL layer is not particularly formed into a pattern, therefore, the same effect as in the case of formation of an organic EL layer into a pattern can be obtained. Therefore, there is a merit that works for forming an organic EL layer can be simplified, and an EL element can be produced efficiently.

Such an EL element will be illustrated using a drawing.

Figure 10:
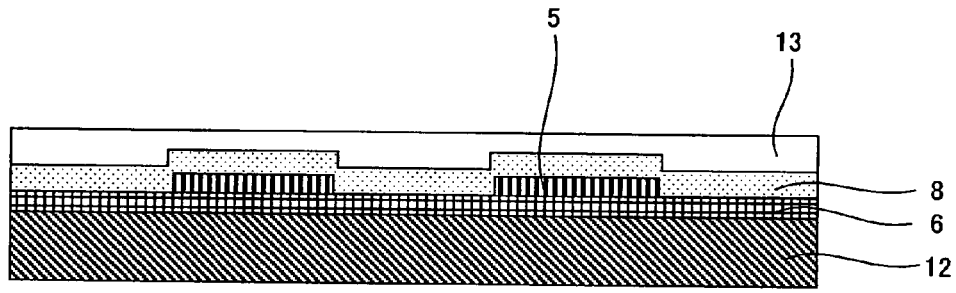
FIG. 10 is a schematic sectional view showing another example of the EL element of the present invention.

FIG. 10 illustrates one example of the EL element of in this case. First, an electric charge injection transportation layer 6 is formed on a first electrode layer 12. On this electric charge injection transportation layer 6, a decomposition removal layer 5 is formed into a pattern. The decomposition removal layer 5 has a property of being decomposed and removed by the action of a photocatalyst in irradiation with energy and has an electric charge shielding property. An organic EL layer 8 is formed to cover not only on the electric charge injection transportation layer 6 but also the surface of the decomposition removal layer 5. In this embodiment, electric charges are not injected into the organic EL layer 9 located on the decomposition removal layer 5 since the decomposition removal layer 5 has an electric charge shielding property even if the organic EL layer 8 is thus not formed into a pattern. Therefore, the same effect as in the case of formation of an organic EL layer into a pattern can be obtained. Further, a second electrode layer 13 which is a transparent electrode is formed on the organic EL layer 8.

In FIG. 10, since the second electrode layer 13 is a transparent electrode, an EL element from the upper surface of which light is derived in FIG. 10 is obtained. A case in which the first electrode layer 12 is a transparent electrode, or a case in which both of the first electrode layer 12 and the second electrode layer 13 area transparent electrode, can also be adopted to give a transparent EL element.

Though in FIG. 10, the decomposition removal layer 5 is formed on the electric charge injection transportation layer 6, it is also possible to form it on the first electrode layer 12. Further, it is also possible that the decomposition removal layer 5 is formed on the first electrode layer 12, the electric charge injection transportation layer as described above is formed on the whole surface of the first electrode layer 12 on which the decomposition removal layer is formed into a pattern, then, further on this electric charge injection transportation layer, the decomposition removal layer 5 is again formed into a pattern, to form a light emitting layer on the whole surface. Furthermore, strength can be maintained by forming an EL element on base material even in the case of an EL element lacking in a self supporting property.

Such an EL element of the present invention can be produced, for example, by the production method in the above-mentioned second embodiment.

Further, members constituting such an EL element are the same as described in the first embodiment and second embodiment, therefore, descriptions thereof are omitted here.

The present invention is not limited to the above-mentioned embodiments. The above-mentioned embodiments are only examples, and any embodiments having substantially the same constitution and performing the same action and effect as the technological idea described in claims of the present invention are included in the technological range of the present invention.

EXAMPLES

The following examples will further illustrate the present invention.

1. Formation of Photocatalyst Treatment Layer Substrate 5 g of trimethoxymethylsilane (TSL8113, manufactured by GE Toshiba Silicones) and 2.5 g of 0.5 N hydrochloric acid were mixed, and stirred for 8 hours. This was diluted to 10 times with isopropyl alcohol and used as a primer layer composition.

The above-mentioned primer layer composition was coated on a photomask substrate by a spin coater, and dried at 150° C. for 10 minutes, to form a transparent primer layer (thickness: 0.2 μm).

Next, 30 g of isopropyl alcohol, 3 g of trimethoxymethylsilane (TSL8113, manufactured by GE Toshiba Silicones)

and 20 g of ST-K03 (manufactured by Ishihara Sangyo Kaisha, Ltd.) which is a photocatalyst inorganic coating agent were mixed, and stirred at 100° C. for 20 minutes. This was diluted to 3 times with isopropyl alcohol to give a photocatalyst treatment layer composition.

The above-mentioned photocatalyst treatment layer composition was coated by a spin coater on a photomask substrate on which a primer layer had been formed, and dried at 150° C. for 10 minutes, to form a transparent photocatalyst-treated layer (thickness: 0.15 μm).

2. Formation of Electrode Layer, Hole Transportation Layer or Decomposition Removal Layer Example 1

On a cleaned glass substrate having a thickness of 1.1 mm was formed ITO as an electrode layer showing a change in wettability by sputtering, for patterning of ITO having a line width of 80 μm at an interval of 20 μm.

Example 2

On an ITO substrate patterned in the same manner as in Example 1, as hole transportation layer, polyethylenedioxythiophene/polystyrene sulfonate (PEDOT/PSS) coating solution (BaytronP:manufactured by Bayer) was coated by spin coating so that the dry thickness was 700 Å, and dried in vacuum at 100° C. for 1 hour.

Example 3

On the same substrate as in Example 1, a cationic polymer polydiallyldimethylammonium chloride (PDDA, average molecular weight: 100000 to 200000, Aldrich) and an anionic polymer sodium polystyrenesulfonate (PSS, average molecular weight: 70000, Aldrich) were adsorbed alternately on a glass substrate, as the decomposition removal layer, to give a thickness of about 2 nm.

Example 4

The decomposition removal layer shown in Example 3 was formed in the same manner on the substrate of Example 2.

Example 5

On the same substrate as in Example 1, 2 g of Europin Z400 (manufactured by Mitsubishi Gas Chemical Company, Inc.) containing a polycarbonate as the main component was dissolved in 30 g of dichloromethane and 70 g of 112 trichloroethane and coated by a spin coater, and dried at 100° C. for 60 minutes, to form a transparent decomposition removal layer (thickness: 0.01 μm).

Example 6

The same substrate as in Example 5 was produced.

3. Patterning of Electrode Layer, Hole Transportation Layer or Decomposition Removal Layer A photocatalyst treatment layer substrate and the electrode layer, hole transportation layer or decomposition removal layer were allowed to face at a gap of 100 μm under alignment, and irradiated under alignment in the form of pattern at an illumination of 40 mW/cm$^2$ by a photomask super high pressure mercury lamp (wavelength: 365 nm) while changing the exposure time as shown in the following Table 1 at every example described above.

TABLE 1

| Example | Exposure time |
| --- | --- |
| Example 1 | Exposed for 120 seconds, and a pattern of a difference in wettability was formed on an ITO electrode layer. |
| Example 2 | Exposed for 120 seconds, and a pattern of a difference in wettability was formed on an hole transportation layer. |
| Examples 3 and 4 | Exposed for 120 seconds, and a decomposition removal layer was decomposed and removed. |
| Examples 5 and 6 | Exposed for 600 seconds, and a decomposition removal layer was decomposed and removed. |

4. Formation of Light Emitting Layer

Coating solution of the following composition was prepared.

| | |
| --- | --- |
| Polyvinylcarbazole (see the following chemical formula 2) | 7 parts by weight |
| Light emitting dye (see the following chemical formulae 3 to 5) | 0.1 part by weight |
| Oxadiazole compound (see the following chemical formula 6) | 3 parts by weight |
| Toluene | 5050 parts by weight |

The chemical formula of the polyvinylcarbazole is shown in the following chemical formula 2.

Chemical formula 2

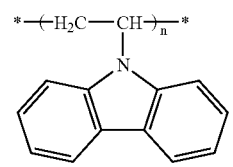

The chemical formula of coumarin 6 as a green light emitting dye is shown in the following chemical formula 3.

Chemical formula 3

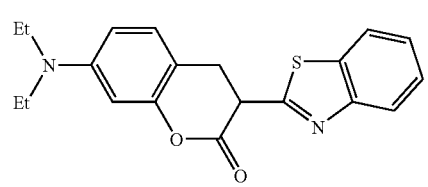

The chemical formula of Nile Red as a red light emitting dye is shown in the following chemical formula 4.

Chemical formula 4

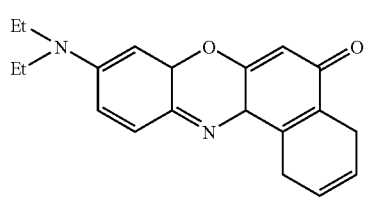

The chemical formula of perylene as a blue light emitting dye is shown in the following chemical formula 5.

Chemical formula 5

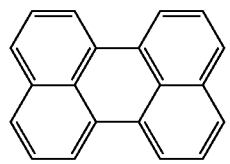

The chemical formula of an oxadiazole compound is shown in the following chemical formula 6.

Chemical formula 6

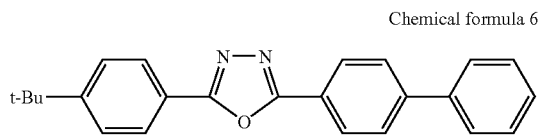

In Example 1, on the electrode layer, in Example 2, on the hole transportation layer, in Examples 3 to 5, on a part from which the decomposition removal layer had been removed, the above-mentioned R, G and B inks were coated by an ink jet apparatus, and dried at 120° C. for 30 minutes in a vacuum over, to obtain a light emitting layer having a dry thickness of 700 Å.

In Example 6, the coating solution of G was coated by spin coating on the whole surface on the decomposition removal layer formed into a pattern.

5. Formation of Cathode

An AlLi alloy was vapor-deposited at a thickness of 500 nm, a line width of 80 μm and an interval of 20 μm as the upper electrode so that it crossed at right angle a pattern of ITO and light emitting layer.

6. Confirmation of Light Emission

Light emission was confirmed while applying a voltage of 8 V to the cathode side for the ITO side. The results are shown in the following Table 2.

TABLE 2

| Example | Kind of substrate | Result |
|---|---|---|
| Example 1 | ITO substrate, no decomposition removal layer, ink jet coating | Uniform light emission with line pattern |
| Example 2 | ITO/hole transportation layer substrate, no decomposition removal layer, ink jet coating | Uniform light emission with line pattern |
| Example 3 | ITO substrate, decomposition removal layer (cationic polymer), ink jet coating | Uniform light emission with line pattern |
| Example 4 | ITO/hole transportation layer substrate, decomposition removal layer (cationic polymer), ink jet coating | Uniform light emission with line pattern |
| Example 5 | ITO substrate, decomposition removal layer (polycarbonate), ink jet coating | Uniform light emission with line pattern |
| Example 6 | ITO substrate, decomposition removal layer (polycarbonate), spin coating | Uniform light emission with line pattern |

What is claimed is:

1. An electroluminescent element comprising at least: a first electrode layer; a decomposition removal layer which is in the form of pattern on the first electrode layer or on an electric charge injection transportation layer formed on the first electrode layer, decomposed and removed by the action of a photocatalyst in irradiation with energy, and shows different contact angle with liquid from that of the first electrode layer or the electric charge injection transportation layer; an organic electroluminescent layer which is in the form of pattern on the electrode layer or on electric charge injection transportation layer exposed by decomposition and removal of the decomposition removal layer and contains at least a light emitting layer; and a second electrode layer formed on the organic electroluminescent layer.

2. The electroluminescent element according to claim 1, wherein the first electrode layer is formed on a base material.

3. An electroluminescent element comprising at least: a first electrode layer; a decomposition removal layer which is in the form of pattern on the first electrode layer or an electric charge injection transportation layer formed on the first electrode layer, decomposed and removed by the action of a photocatalyst in irradiation with energy, and has an electric charge shielding property; an organic electroluminescent layer which is formed so as to coat the first electrode layer and decomposition removal layer and contains at least a light emitting layer; and a second electrode layer formed on the organic electroluminescent layer.

4. The electroluminescent element according to claim 3, wherein the first electrode layer is formed on a base material.

* * * * *